(12) United States Patent
Seo et al.

(10) Patent No.: US 11,296,284 B2
(45) Date of Patent: Apr. 5, 2022

(54) ORGANIC LIGHT-EMITTING DIODE DISPLAY DEVICE AND METHOD OF MANUFACTURING THE SAME

(71) Applicant: Samsung Display Co., Ltd., Yongin-Si (KR)

(72) Inventors: Junghan Seo, Seoul (KR); Wooyong Sung, Seoul (KR)

(73) Assignee: Samsung Display Co., Ltd.

( * ) Notice: Subject to any disclaimer, the term of this patent is extended or adjusted under 35 U.S.C. 154(b) by 59 days.

(21) Appl. No.: 16/397,986

(22) Filed: Apr. 29, 2019

(65) Prior Publication Data

US 2020/0006682 A1 Jan. 2, 2020

(30) Foreign Application Priority Data

Jun. 29, 2018 (KR) .................. 10-2018-0075296

(51) Int. Cl.
  *H01L 51/52* (2006.01)
  *H01L 51/00* (2006.01)
  *H01L 27/32* (2006.01)
  *H01L 51/56* (2006.01)

(52) U.S. Cl.
  CPC ...... *H01L 51/0097* (2013.01); *H01L 27/3244* (2013.01); *H01L 51/003* (2013.01); *H01L 51/56* (2013.01); *H01L 2227/326* (2013.01); *H01L 2251/5338* (2013.01)

(58) Field of Classification Search
  CPC .. H01L 51/52; H01L 27/3246; H01L 51/5225
  See application file for complete search history.

(56) References Cited

U.S. PATENT DOCUMENTS

| | | | |
|---|---|---|---|
| 9,337,211 | B2 | 5/2016 | Kim et al. |
| 9,653,652 | B2 | 5/2017 | Shin et al. |
| 9,673,014 | B2 | 6/2017 | Kim et al. |
| 2017/0026553 | A1 | 1/2017 | Lee et al. |
| 2017/0117336 | A1 | 4/2017 | Rappoport et al. |
| 2017/0148856 | A1* | 5/2017 | Choi .................. H01L 51/0096 |
| 2017/0222192 | A1 | 8/2017 | You et al. |

FOREIGN PATENT DOCUMENTS

| | | |
|---|---|---|
| KR | 10-2014-0009920 A1 | 1/2014 |
| KR | 10-2014-0147590 A1 | 12/2014 |
| KR | 10-2015-0018680 A1 | 2/2015 |
| KR | 10-2015-0108478 A1 | 9/2015 |
| KR | 10-2017-0059864 A1 | 5/2017 |

* cited by examiner

*Primary Examiner* — Moazzam Hossain
*Assistant Examiner* — Hajar Kolahdouzan
(74) *Attorney, Agent, or Firm* — Innovation Counsel LLP

(57) ABSTRACT

An organic light emitting display device includes: a flexible substrate having a groove that is undercut; a common layer disposed on the flexible substrate, including an organic light emitting layer, and disconnected by the groove; and a sealing member disposed on the common layer and covering the common layer. The flexible substrate includes a first substrate layer and a first barrier layer disposed on the first substrate layer. The first barrier layer protrudes with respect to the first substrate layer at the groove. The first barrier layer that protrudes has a waveform.

19 Claims, 27 Drawing Sheets

ORGANIC LIGHT-EMITTING DIODE DISPLAY DEVICE AND METHOD OF MANUFACTURING THE SAME

CROSS-REFERENCE TO RELATED APPLICATION

This application claims priority under 35 U.S.C. § 119 to Korean Patent Application No. 10-2018-0075296, filed on Jun. 29, 2018, in the Korean Intellectual Property Office (KIPO), the disclosure of which is incorporated by reference herein in its entirety.

TECHNICAL FIELD

Aspects of the present disclosure relate to a display device, and more particularly, to an organic light emitting diode ("OLED") display device and a method of manufacturing the OLED display device.

DISCUSSION OF RELATED ART

A display device is an apparatus for displaying images, and recently, OLED display devices have attracted attention. Such OLED display devices have self-emission characteristics, and accordingly, dissimilar to liquid crystal display ("LCD") devices, thickness and weight of the OLED display devices can be reduced because a separate light source is not required therein. In addition, the OLED display device has high quality characteristics such as low power consumption, high luminance, and high reaction speed.

In order to improve the performance and lifetime of OLED display devices, it is needed that hermetic sealing be provided in order to substantially minimize the influence of external moisture and oxygen. However, in conventional OLED display devices, there is a problem that the OLED in the OLED display device is deteriorated due to oxygen and moisture externally introduced into the OLED display device.

In order to substantially prevent moisture permeation of OLED display devices, a method of using a groove having an undercut is proposed.

However, when a process of defining the groove using, e.g., a laser is completed, it is necessary to remove residual materials generated during the process of defining the groove before forming a common layer. To this end, a cleaning method using high-pressure water may be employed. However, a protruding barrier layer may be damaged in the cleaning process, and the reliability of the moisture permeation preventing function may then be lowered.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Embodiments may be directed to an organic light emitting diode ("OLED") display device capable of enhancing the reliability of moisture permeation prevention of the OLED display device.

According to an embodiment, an organic light emitting display device includes: a flexible substrate having a groove that is undercut; a common layer disposed on the flexible substrate, including an organic light emitting layer, and disconnected by the groove; and a sealing member disposed on the common layer and covering the common layer. The flexible substrate includes a first substrate layer and a first barrier layer disposed on the first substrate layer. The first barrier layer protrudes with respect to the first substrate layer at the groove. The first barrier layer that protrudes has a waveform.

The first barrier layer may have a straight line shape in a first direction in which the first barrier layer protrudes and have a waveform in a second direction that is perpendicular to the first direction.

In the second direction, the waveform may have ridges and valleys, and a ratio of a height difference between the ridges and the valleys to a distance between adjacent ones of the ridges may be in a range from about ⅕ to about 5.

The ratio of the height difference between the ridges and the valleys to the distance between adjacent ones of the ridges may be in a range from about ½ to about 2.

The flexible substrate may have a through hole, and the groove may enclose the through hole.

The first direction may be a direction that passes through a center of the through hole, and the second direction may be a circumferential direction with respect to the center.

At least a portion of the first barrier layer that contacts the first substrate layer may have the waveform.

A length of the at least a portion of the first barrier layer may be substantially equal to or longer than a length of a protruding portion of the first barrier layer in the first direction.

The first barrier layer that has the waveform may be located between a display area at which images are configured to be displayed and the through hole.

The first barrier layer may include a first intermediate barrier layer which connects the first barrier layer that is located at the display area and the first barrier layer that has the waveform.

The first intermediate barrier layer may extend upward from the first barrier layer that has the waveform.

The first intermediate barrier layer may extend downward from the first barrier layer that has the waveform.

The flexible substrate may further include a second substrate layer disposed on the first barrier layer and a second barrier layer disposed on the second substrate layer. The second barrier layer may protrude with respect to the second substrate layer at the groove.

The second barrier layer that protrudes may have a waveform.

The waveform of the second barrier layer may correspond to the waveform of the first barrier layer.

The second barrier layer that protrudes may be planar.

The first substrate layer includes one or more selected from a group consisting of polyimide (PI), polyethylene naphthalate (PEN), polyethylene terephthalate (PET), polyarylate, polycarbonate (PC), polyetherimide (PEI), and polyethersulfone (PES).

The second substrate layer includes one or more selected from a group consisting of polyimide (PI), polyethylene naphthalate (PEN), polyethylene terephthalate (PET), polyarylate, polycarbonate (PC), polyetherimide (PEI), and polyethersulfone (PES).

According to an embodiment, an organic light emitting display device includes: a substrate including a display area, a through area, and a peripheral area and having a groove that is undercut and defined at the peripheral area; an organic light emitting element disposed on the substrate at the display area; a common layer disposed on the substrate at the peripheral area and disconnected by the groove; and a sealing member disposed on the organic light emitting element and the common layer. The substrate includes a substrate layer and a barrier layer that is disposed on the substrate layer and protrudes with respect to the substrate layer. The barrier layer on the peripheral area has a waveform.

The peripheral area may be located between the display area and the through area. The barrier layer may have a straight line shape in a first direction in which the barrier layer protrudes, and have the waveform in a second direction that is perpendicular to the first direction.

The peripheral area may surround the through area. The display area may surround the peripheral area. The barrier layer may have the straight line shape in a direction that passes through a center of the through area and has the waveform in a circumferential direction with respect to the center.

According to an embodiment, a method of manufacturing an organic light emitting display device includes: preparing a carrier substrate; forming a flexible substrate on the carrier substrate; defining a groove that is undercut at the flexible substrate; cleaning the flexible substrate at which the groove is defined; forming a common layer on the flexible substrate, the common layer including an organic light emitting layer and disconnected by the groove; and forming a sealing member on the common layer to cover the common layer. Forming the flexible substrate includes: forming a first substrate layer on the carrier substrate; forming a waveform on the first substrate layer at an area that corresponds to the groove; and forming a first barrier layer on the first substrate layer.

Forming the flexible substrate further may include: forming a second substrate layer on the first barrier layer; and forming a second barrier layer on the second substrate layer.

Forming the second substrate layer may include forming a waveform on the second substrate layer.

The waveform of the second substrate layer may correspond to the waveform of the first substrate layer.

An upper surface of the second substrate layer may be planar.

The foregoing is illustrative only and is not intended to be in any way limiting. In addition to the illustrative aspects, embodiments and features described above, further aspects, embodiments and features will become apparent by reference to the drawings and the following detailed description.

BRIEF DESCRIPTION OF THE DRAWINGS

A more complete appreciation of the inventive concept will become more apparent by describing in detail embodiments thereof with reference to the accompanying drawings, wherein.

DETAILED DESCRIPTION

Figure 1A:
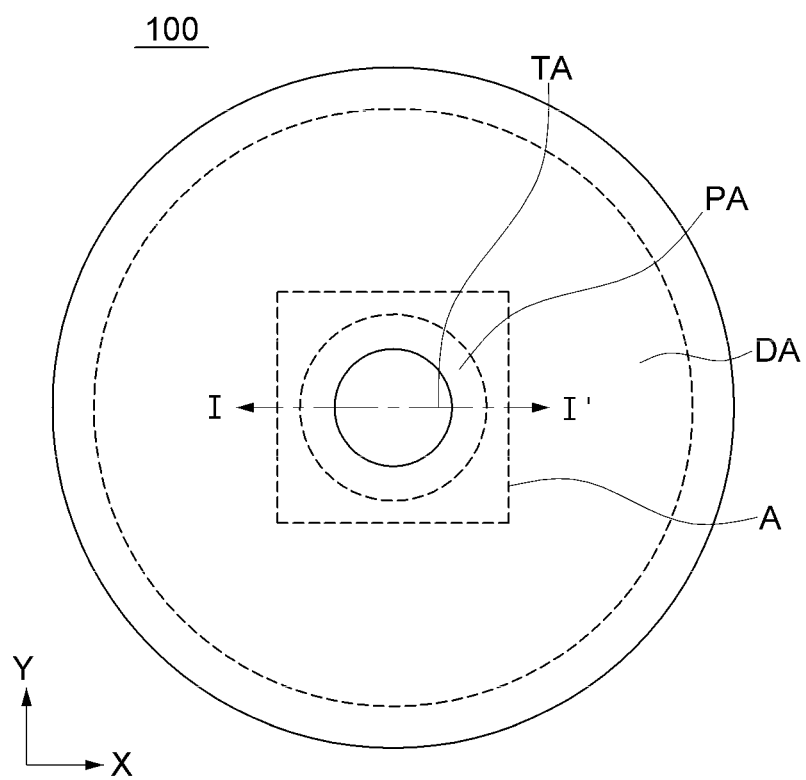
FIGS. 1A and 1B are plan views schematically illustrating an organic light emitting diode ("OLED") display device according to an embodiment.

Embodiments will now be described more fully hereinafter with reference to the accompanying drawings. Although the inventive concept may be modified in various manners and have several embodiments, embodiments are illustrated in the accompanying drawings and will be mainly described in the specification. However, the scope of the inventive concept is not limited to the embodiments and should be construed as including all the changes, equivalents and substitutions included in the spirit and scope of the inventive concept.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below," "beneath," "lower," "above," "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined at the present specification.

Some of the parts which are not associated with the description may not be provided in order to specifically describe embodiments and like reference numerals refer to like elements throughout the specification.

Hereinafter, a schematic planar structure of an organic light emitting diode ("OLED") display device 100 according to an embodiment will be described with reference to FIGS. 1A and 1B.

Figure 1B:
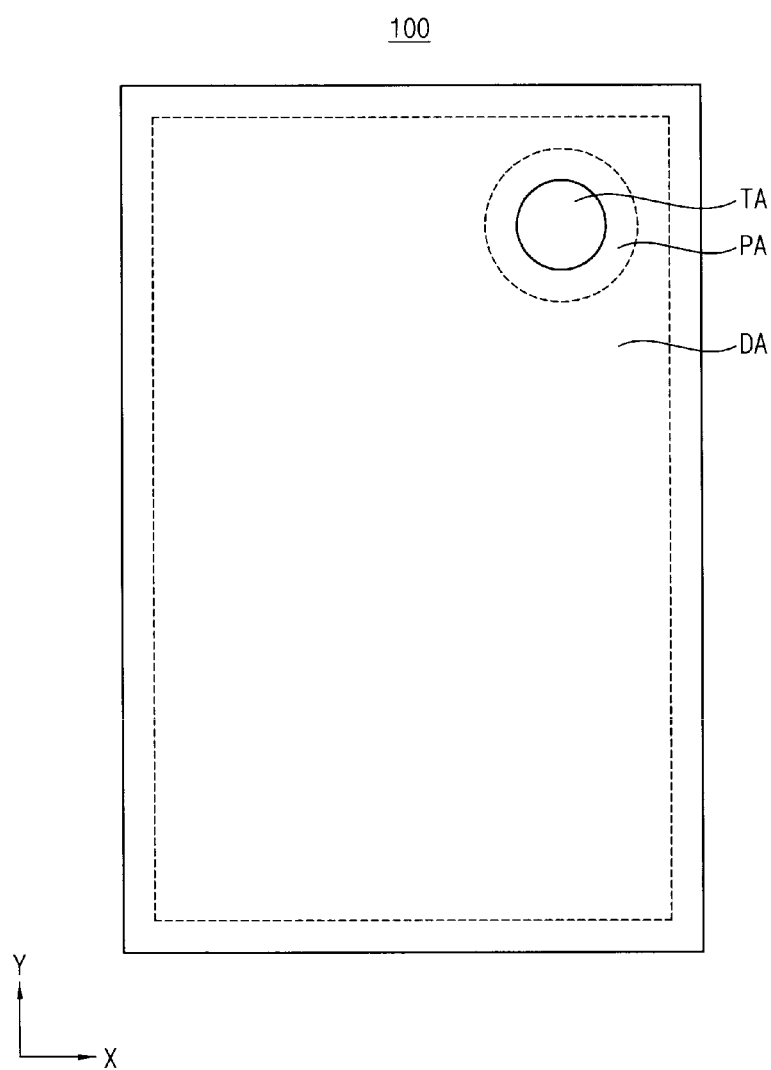

FIGS. 1A and 1B are plan views schematically illustrating the OLED display device 100 according to an embodiment.

Referring to FIGS. 1A and 1B, the OLED display device 100 according to an embodiment may include a display area DA, a through area TA, and a peripheral area PA. In the display area DA, images may be displayed. A plurality of pixels each emitting light may be arranged in the display area DA, so that images may be displayed.

The through area TA may be an area at which, for example, a camera, a sensor, and/or a speaker included in the OLED display device 100 is to be disposed. The through area TA may be provided by forming, for example, an insulating layer, a conductive layer, and an organic layer on a substrate, and then by defining a through hole corresponding to the through area TA. The method of defining such a through hole will be described in detail below.

Although it is illustrated in FIGS. 1A and 1B that the through area TA has a substantially circular shape, embodiments are not limited thereto. The through area TA may have a polygonal shape, e.g., a square and a triangle.

The peripheral area PA may be located between the display area DA and the through area TA. The peripheral area PA may surround the through area TA and the display area DA may surround the peripheral area PA. A driving circuit or the like for applying driving signals (e.g., data signals, gate signals, etc.) to the pixels may be disposed at the peripheral area PA.

Hereinafter, a through hole and a groove that are defined in the OLED display device 100 according to an embodiment will be described with reference to FIGS. 2 and 3.

Figure 2:
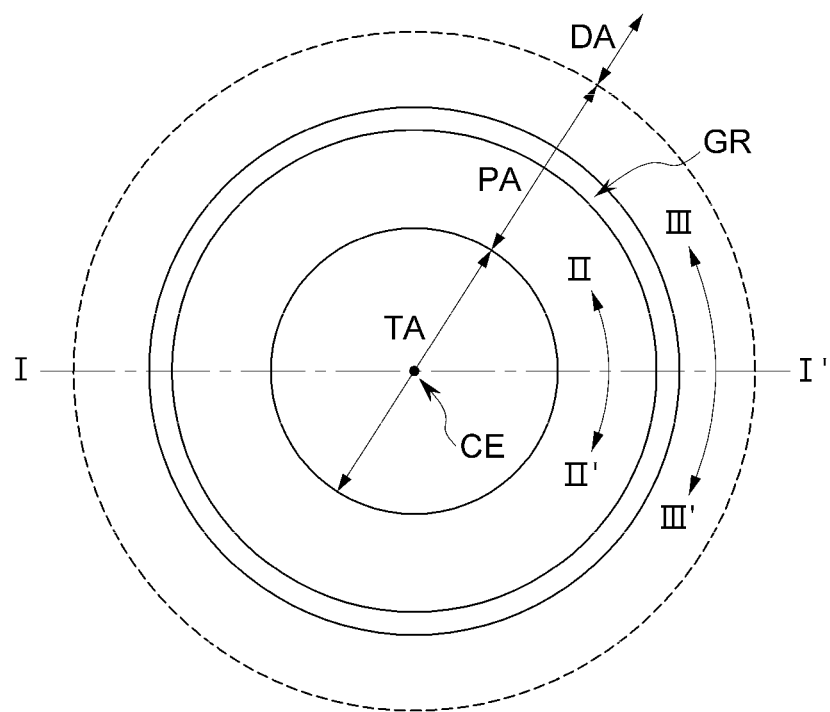
FIG. 2 is a plan view illustrating area A of FIG. 1A.
Figure 3:
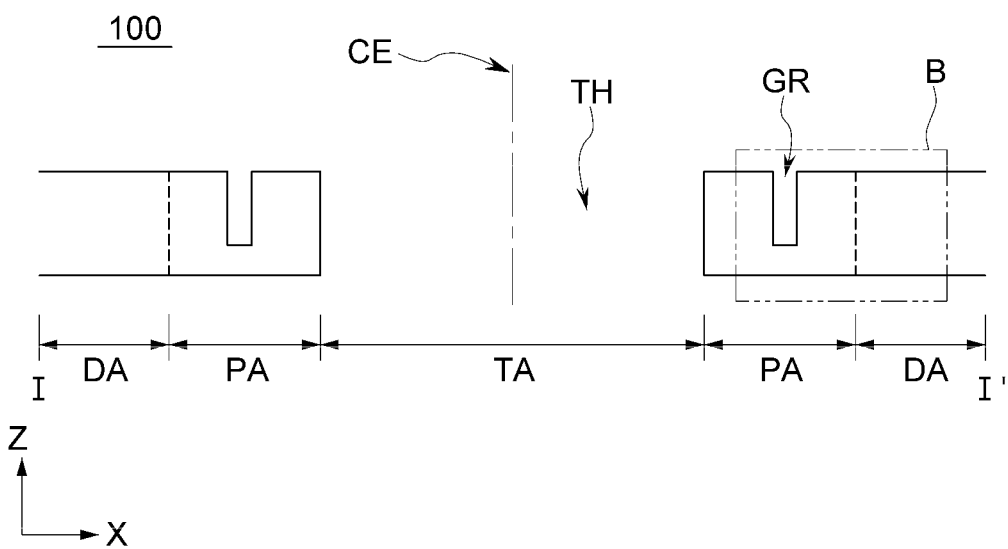
FIG. 3 is a cross-sectional view taken along line I-I' of FIG. 1A.

FIG. 2 is a plan view illustrating area A of FIG. 1A, and FIG. 3 is a cross-sectional view taken along line I-I' of FIG. 1A.

Referring to FIGS. 2 and 3, a through hole TH and a groove GR may be defined in the OLED display device 100 according to an embodiment. The through area TA may be defined by the through hole TH. The groove GR may be defined at the peripheral area PA.

The groove GR may be located between the display area DA and the through area TA. The groove GR may have a shape enclosing the through hole TH. The groove GR may have an undercut shape. The groove GR having the undercut shape may be one of an opening, an aperture and a hole. The through hole TH may have a shape corresponding to the entirety of a thickness of the OLED display device 100. The groove GR may have a shape corresponding to a part of the thickness of the OLED display device 100. For example, the groove GR, in the shape of a circle, has a width in a radial direction toward a center CE of the through hole TH, a length in a circumferential direction with respect to the center CE of the through hole TH, and a depth in a direction perpendicular to the radial direction and the circumferential direction.

Although it is illustrated in FIGS. 2 and 3 that one groove GR is defined at the peripheral area PA by way of example, embodiments are not limited thereto. Alternatively, a plurality of groove GR enclosing the through hole TH may be defined at the peripheral area PA.

Hereinafter, a shape of a barrier layer of the OLED display device 100 according to an embodiment will be described with reference to FIGS. 4A to 4B first, and the arrangement relationship with other components will be described later.

Figure 4A:
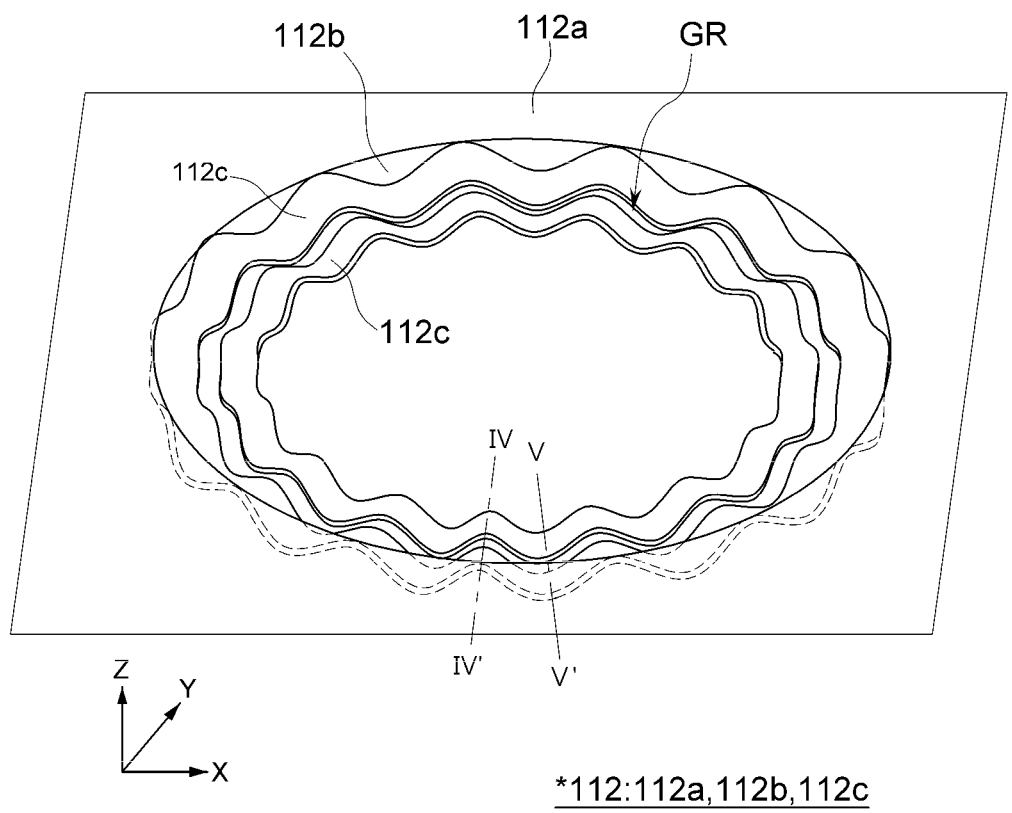
FIGS. 4A and 4B are perspective views illustrating barrier layers according to embodiments.
Figure 4B:
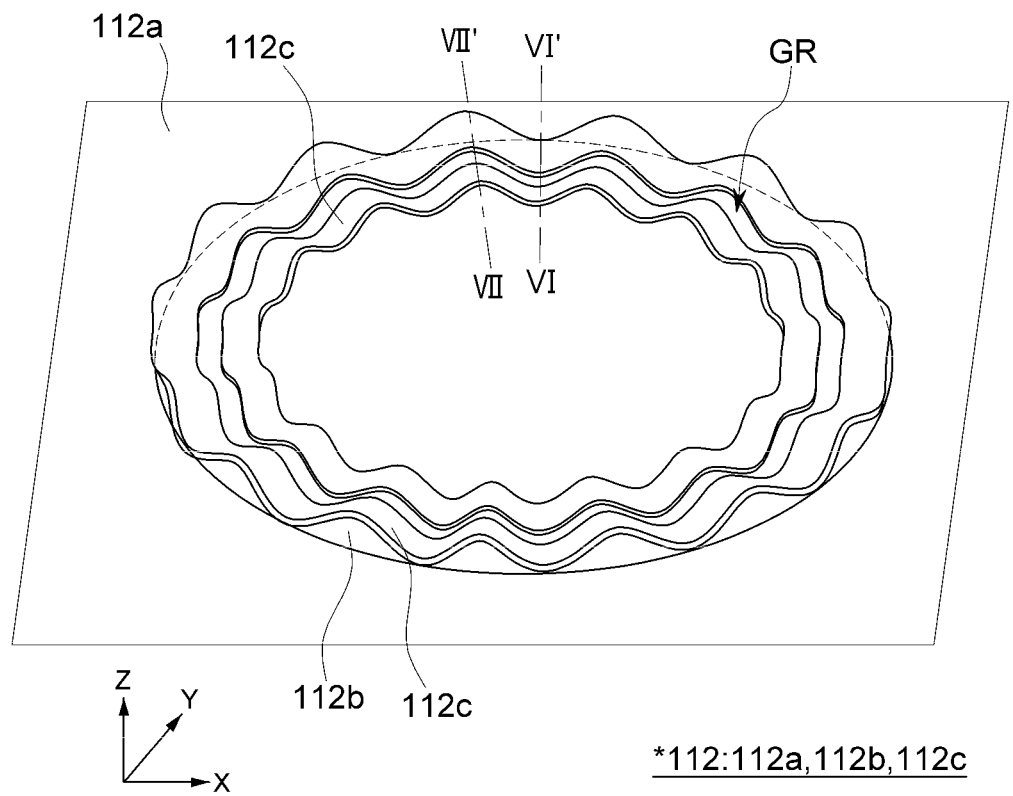

FIG. 4A is a perspective view illustrating a barrier layer 112 according to an embodiment, and FIG. 4B is a perspective view illustrating a barrier layer 112 according to another embodiment. Barrier layer 112 includes barrier layers 112a, 112b, 112c, i.e., portions of barrier layer 112.

The barrier layer 112a (sometimes called a display area barrier layer 112a) of the display area DA is planar. The barrier layer 112c of the peripheral area PA has a straight line shape in the radial direction toward the center CE of the through hole TH and has a waveform in the circumferential direction that is perpendicular to the radial direction.

The barrier layer 112c (sometimes called a waveform barrier layer 112c) having a waveform is disconnected by the groove GR at a middle portion of the barrier layer 112c. The entirety of the barrier layer 112c located between the groove GR and the through hole TH has a waveform in the circumferential direction (or in the length direction of groove GR), and a part of the barrier layer 112c protrudes toward the groove GR with respect to a substrate layer below the barrier layer 112c (and a substrate layer above the barrier layer 112c).

The barrier layer 112b (hereinafter, "an intermediate barrier layer 112b") that is inclined, for example, extends perpendicular to the barrier layer 112a of the display area DA, is disposed between the barrier layer 112c of the peripheral area PA and the barrier layer 112a of the display area DA, and connects the barrier layer 112c of the peripheral area PA and the barrier layer 112a of the display area DA.

The intermediate barrier layer 112b that connects the barrier layer 112c of the peripheral area PA and the barrier layer 112a of the display area DA, i.e., the barrier layer 112c having a waveform and the barrier layer 112a not having a waveform, may be located at the peripheral area PA. Alternatively, the intermediate barrier layer 112b may be located at a border between the display area DA and the peripheral area PA. However, embodiments are not limited thereto, and the intermediate barrier layer 112b may be located at the display area DA. The intermediate barrier layer 112b is located opposite to the through area TA with respect to the groove GR and is supported by a first substrate layer 111 (as illustrated and discussed further below).

A portion of a bottom surface of the barrier layer 112c, having a waveform, is undercut (i.e., exposed from the first substrate layer 111) and contacts a sealing member 150 (as illustrated and discussed further below), and another portion of the bottom surface of the barrier layer 112c, having the waveform, contacts the first substrate layer 111 and is support by the first substrate layer 111. In a direction that passes through the center CE of the through area TA, a length of a portion of the bottom surface that contacts the sealing member 150 may be substantially equal to or less than a length of a portion of the bottom surface that contacts the first substrate layer 111.

As illustrated in FIG. 4A, the barrier layer 112c of the peripheral area PA may have a height (in a Z-axis direction) substantially equal to or less than a height of the barrier layer 112a of the display area DA. For example, a height of a ridge IV-IV' of the barrier layer 112c of the peripheral area PA is substantially equal to the height of the barrier layer 112a of the display area DA, and a height of a valley V-V' of the barrier layer 112c of the peripheral area PA is less than the height of the barrier layer 112a of the display area DA. Accordingly, the intermediate barrier layer 112b extends downward from the barrier layer 112a of the display area DA.

As illustrated in FIG. 4B, the barrier layer 112c of the peripheral area PA may have a height (in the Z-axis direction) substantially equal to or higher than the height of the barrier layer 112a of the display area DA. For example, a height of a valley VI-VI' of the barrier layer 112c of the peripheral area PA is substantially equal to the height of the barrier layer 112a of the display area DA, and a height of a ridge VII-VII' of the barrier layer 112c of the peripheral area PA is higher than the height of the barrier layer 112a of the display area DA. Accordingly, the barrier layer 112b between the barrier layer 112a and the barrier layer 112c extends upward from the barrier layer 112a of the display area DA. The heights of the barrier layers 112a and 112c are defined to be a distance from an arbitrary plane parallel to the barrier layer 112a of the display area DA, for example, a bottom surface of a substrate layer 111 (as illustrated and discussed further below).

The above-described structure of the barrier layer may be applied to either or both of a first barrier layer, e.g., barrier layers 112, 212, 312, 412, and 512, and a second barrier layer, e.g., barrier layers 114, 214, 314, 414, and 514 (as illustrated and discussed further below).

In the above and following description, the groove GR has been described as a circle enclosing the through hole TH, and a thickness direction (a radial direction) and a length direction (a circumferential direction) have been defined based on it. As described above, the groove GR may be in a polygonal shape, for example, a quadrangle and a triangle, and may include any type of linear shape in a curved or straight line in the length direction. The length direction of the groove GR in an arbitrary shape or the barrier layer 112c having a waveform may be defined by a border line between the barrier layer 112c and the groove GR, or a border line between the substrate layer 111 that supports the barrier layer 112c and the groove GR on a plane (an XY plane). The thickness direction may be defined as a direction in which the barrier layer 112c protrudes from the substrate layer 111 that supports the barrier layer 112c, i.e., a direction perpendicular to the length direction.

Hereinafter, a cross-sectional structure of an OLED display device according to an embodiment will be described in detail with reference to FIGS. 5A, 5B, 5C and 5D.

Figure 5A:
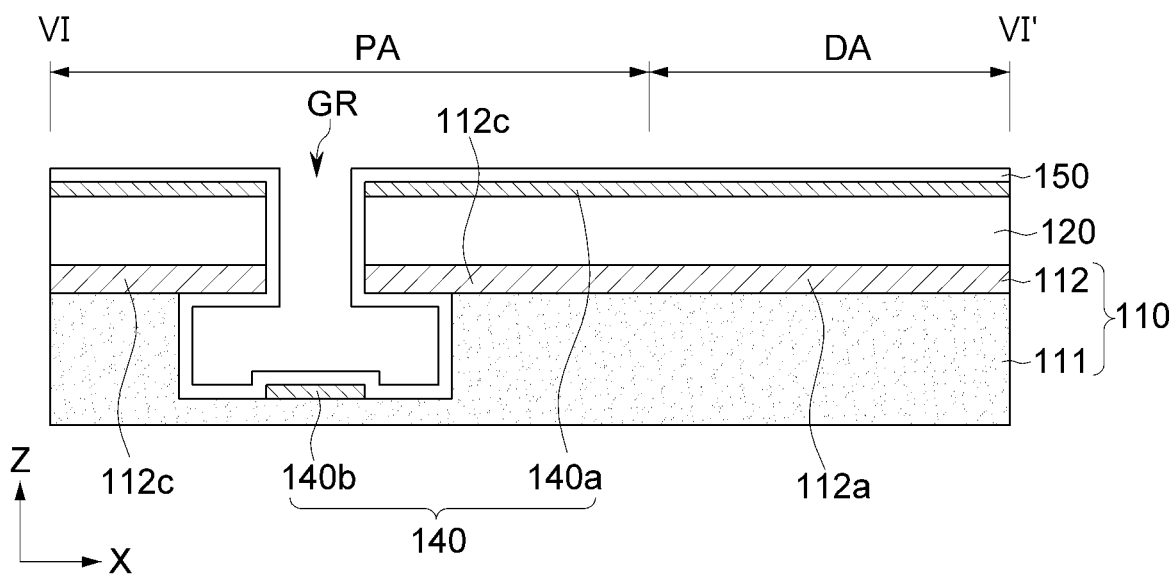
FIGS. 5A, 5B, 5C, and 5D are cross-sectional views illustrating OLED display devices according to an embodiment.
Figure 5B:
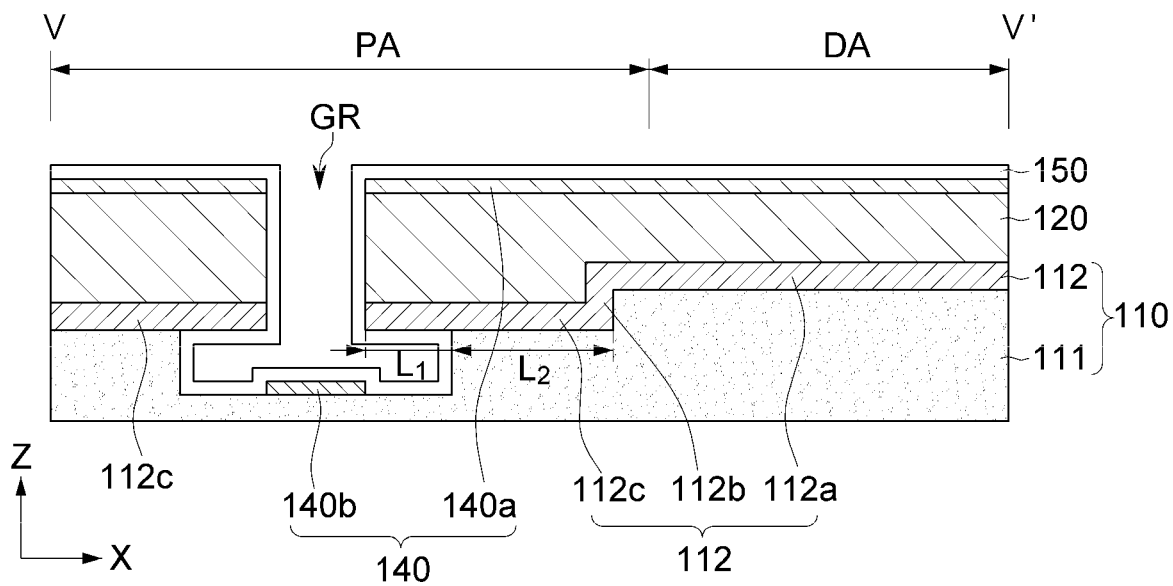
Figure 5C:
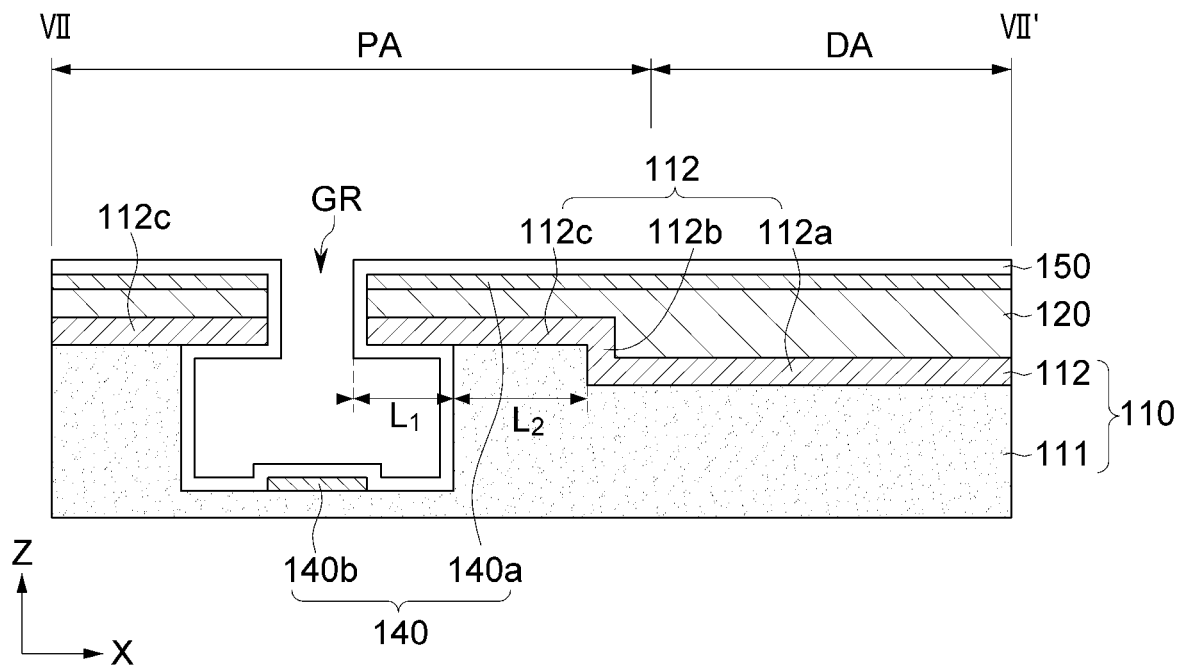
Figure 5D:
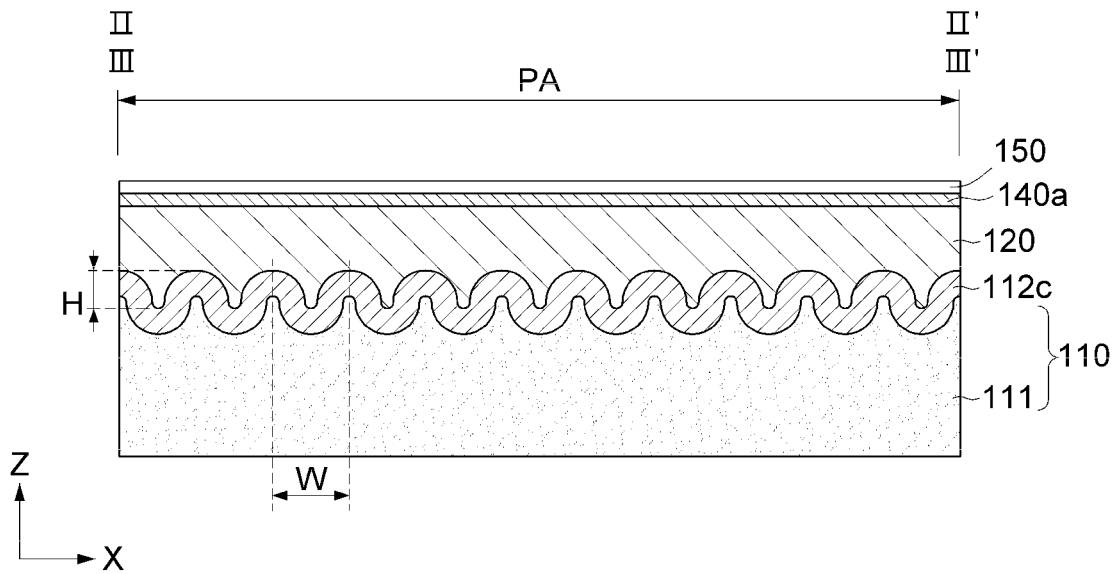

FIGS. 5A, 5B, and 5C are enlarged cross-sectional views of area B in FIG. 3, taken along line I-I' in a radial direction in FIG. 1A. More specifically, FIG. 5A is a cross-sectional view taken along line IV-IV' in FIG. 4A or VI-VI' in FIG. 4B. FIG. 5B is a cross-sectional view taken along line V-V' in FIG. 4A. FIG. 5C is a cross-sectional view taken along line VII-VII' in FIG. 4B. FIG. 5D is a cross-sectional view taken along line II-II' or line III-III' in a circumferential direction of FIG. 2.

Description common to FIGS. 5A, 5B, 5C and 5D will be described first. The OLED display device 100 according to an embodiment may include a flexible substrate 110, a substructure 120, a common layer 140, and the sealing member 150.

The flexible substrate 110 may include a first substrate layer 111 and a first barrier layer 112. The first substrate layer 111 may include a glass layer 111. The first substrate layer 111 may include one or more plastic materials of polyimide (PI), polyethylene naphthalate (PEN), polyethylene terephthalate (PET), polyarylate, polycarbonate (PC), polyetherimide (PEI), and polyethersulfone (PES), which are excellent in heat resistance and durability.

A plastic material, i.e., a material forming the first substrate layer 111, easily permeates, for example, water and oxygen, as compared to a glass substrate, and thus may degrade an organic light emitting layer that is vulnerable to moisture or oxygen, and lower the lifetime of the OLED. In order to substantially prevent this, the first barrier layer 112 may be disposed on the first substrate layer 111.

The first barrier layer 112 may include an inorganic material such as silicon oxide, silicon nitride, and amorphous silicon. It is desirable that a moisture permeability of the first barrier layer 112 be about $10^{-5}$ g/m$^2$×days or less.

As described above, the first barrier layer 112 adjacent to the groove GR has a waveform of which a height changes in the circumferential direction (length direction), and has a straight line shape in the radial direction (thickness direction).

The groove GR may be defined at the flexible substrate 110. The groove GR may be defined at the peripheral area PA. The groove GR may have a shape corresponding to a part of a thickness of the flexible substrate 100. For example, the groove GR may have a shape corresponding to the entirety of a thickness of the first barrier layer 112 and a part of a thickness of the first substrate layer 111.

The groove GR may have an undercut shape. For example, at the groove GR, the first substrate layer 111 may be undercut with respect to the first barrier layer 112. In other words, the first barrier layer 112 having a waveform at the groove GR may protrude as compared to the first substrate layer 111. Accordingly, a width of the groove GR at the first substrate layer 111 may be larger than a width of the groove GR at the first barrier layer 112.

The substructure 120 may be disposed on the flexible substrate 110, and the common layer 140 may be disposed on the substructure 120. The substructure 120 will be described below with reference to FIG. 9. The common layer 140 may include an organic light emitting layer.

The common layer 140 may be disconnected by the groove GR. The common layer 140 may include a first portion 140a disposed outside the groove GR and a second portion 140b disposed in the groove GR. For example, the first portion 140a may be disposed on the first barrier layer 112 outside the groove GR. In addition, the second portion 140b may be disposed on the first substrate layer 111 in the groove GR.

The first portion 140a and the second portion 140b of the common layer 140 may be disconnected from each other. The first portion 140a and the second portion 140b of the common layer 140 may be disconnected from each other by the undercut shape of the groove GR and the depth of the groove GR.

On the common layer 140 may be disposed the sealing member 150 that covers the common layer 140. The sealing member 150 may include an inorganic material, for example, aluminum oxide, silicon oxide, silicon nitride, silicon oxynitride, silicon carbide, titanium oxide, zirconium oxide, and zinc oxide.

The sealing member 150 may cover the first portion 140a of the common layer 140, the second portion 140b of the common layer 140, and a surface of the flexible substrate 110 that is exposed by the groove GR. In specific, the sealing member 150 may cover an upper surface and a side surface of the first portion 140a of the common layer 140, an upper surface and a side surface of the second portion 140b of the common layer 140, an upper surface and a side surface of the first substrate layer 111 that are exposed by the groove GR, and a bottom surface and a side surface of the first barrier layer 112.

Hereinafter, a structure of the first barrier layer 112 will be described in detail with reference to FIGS. 5A to 5D. As described above, FIGS. 5A and 5B are cross-sectional views taken along lines IV-IV' and V-V' of FIG. 4A, respectively. FIGS. 5A and 5C are cross-sectional views taken along lines VI-VI' and VII-VII' of FIG. 4B, respectively. FIG. 5D corresponds to both cross-sectional views of FIGS. 4A and 4B.

First, referring to FIGS. 5A, 5B and 5D, the first barrier layer 112 of the type illustrated in FIG. 4A will be described.

FIG. 5A is a cross-sectional view taken along a ridge of the first barrier layer 112, FIG. 5B is a cross-sectional view taken along a valley of the first barrier layer 112, and FIG. 5D is a cross-sectional view in a circumferential direction.

Referring to FIG. 5A, the first barrier layer 112c of the peripheral area PA corresponds to the ridge of the waveform, and is substantially equal in height to the first barrier layer 112a.

Referring to FIG. 5B, the first barrier layer 112c of the peripheral area PA corresponds to the valley of the waveform, and is lower in height than the first barrier layer 112a of the display area DA that is planar. The first intermediate barrier layer 112b connects the first barrier layer 112c of the peripheral area PA and the first barrier layer 112a of the display area DA. The first intermediate barrier layer 112c may extend downward from the first barrier layer 112a of the display area DA. An upper surface of the substructure 120 is planar and thus the first portion 140a of the common layer 140 and the sealing member 150 that are disposed on the first barrier layer 112c may be planar. In an embodiment, the first portion 140a of the common layer 140 and the sealing member 150 that are disposed on the first barrier layer 112c may have a waveform in accordance with the first barrier layers 112a, 112b, and 112c.

The intermediate barrier layer 112b is located on the opposite side of the through hole TH with respect to the groove GR. A portion of the bottom surface of the barrier layer 112c that has a waveform is undercut and contacts the sealing member 150, and a remaining portion of the bottom surface of the barrier layer 112c that has a waveform contacts the first substrate layer 111. In the radial direction, a length L1 of the portion of the bottom surface that contacts the sealing member 150 may be substantially equal to or less than a length L2 of the portion of the bottom surface that contacts the first substrate layer 111.

Referring to FIG. 5D, the first barrier layer 112c of the peripheral area PA has a waveform of which a height changes in the circumferential direction. The first portion 140a of the common layer 140 and the sealing member 150 that are disposed on the first barrier layer 112c of the peripheral area PA may be planar or may have a waveform corresponding to a shape of the first barrier layer 112c.

A ratio of an amplitude H which is a height difference between the top of the valley and the top of the ridge of the first barrier layer 112c of the peripheral area PA with respect to a wavelength W which is a distance between adjacent valleys (or adjacent ridges) of the first barrier layer 112c has a predetermined value. The amplitude H may be a height difference between the bottom of the valley and the bottom of the ridge of the first barrier layer 112c of the peripheral area PA. As the ratio decreases, the first barrier layer 112c is likely to be damaged by a force applied in a vertical direction (Z direction). The ratio of the amplitude H between the valley and the ridge with respect to the wavelength W between adjacent valleys thereof (or adjacent ridges thereof) may be in a range from about ⅕ to about 5, and more suitable, from about ½ to about 2.

Referring to FIG. 5D, the waveform of the first barrier layer 112c at the peripheral area PA has a curved line shape as a sin function. However, embodiments are not limited thereto, and the waveform of the first barrier layer 112c may have various shapes, e.g., triangle, quadrangle, and trapezoid.

Next, the first barrier layer 112 of the type illustrated in FIG. 4B will be described with reference to FIGS. 5A, 5C, and 5D.

FIG. 5A is a cross-sectional view along a direction of the valley of the first barrier layer 112, FIG. 5C is a cross-sectional view along a direction of the ridge of the first barrier layer 112, and FIG. 5D is a cross-sectional view in the circumferential direction.

Referring to FIG. 5A, the first barrier layer 112c of the peripheral area PA corresponds to the valley of the waveform, and is substantially equal in height to the first barrier layer 112a of the display area DA.

Referring to FIG. 5C, the first barrier layer 112c of the peripheral area PA corresponds to the ridge of the waveform, and is higher in height than the first barrier layer 112a of the display area DA. The first intermediate barrier layer 112b connects the first barrier layer 112c of the peripheral area PA and the first barrier layer 112a of the display area DA. The first intermediate barrier layer 112b may extend upward from the first barrier layer 112a of the display area DA. The first portion 140a of the common layer 140 and the sealing member 150 that are disposed on the first barrier layer 112c may be planar or have a waveform as the first barrier layer 112c.

In addition, as described above, the intermediate barrier layer 112b is located on the opposite side of the through hole TH with respect to the groove GR.

Referring to FIG. 5D, the waveform of the first barrier layer 112c at the peripheral area PA of FIG. 4B has a shape substantially the same as the waveform of the first barrier layer 112c at the peripheral area PA of FIG. 4A. However, the waveform of the first barrier layer 112c of the peripheral area PA of FIG. 4B may be higher in height than the first barrier layer 112c of the peripheral area PA of FIG. 4A by a height of the waveform (the height difference between the ridge and the valley).

Hereinafter, a cross-sectional structure of an OLED display device according to an embodiment will be described in detail with reference to FIGS. 6A to 6D.

Figure 6A:
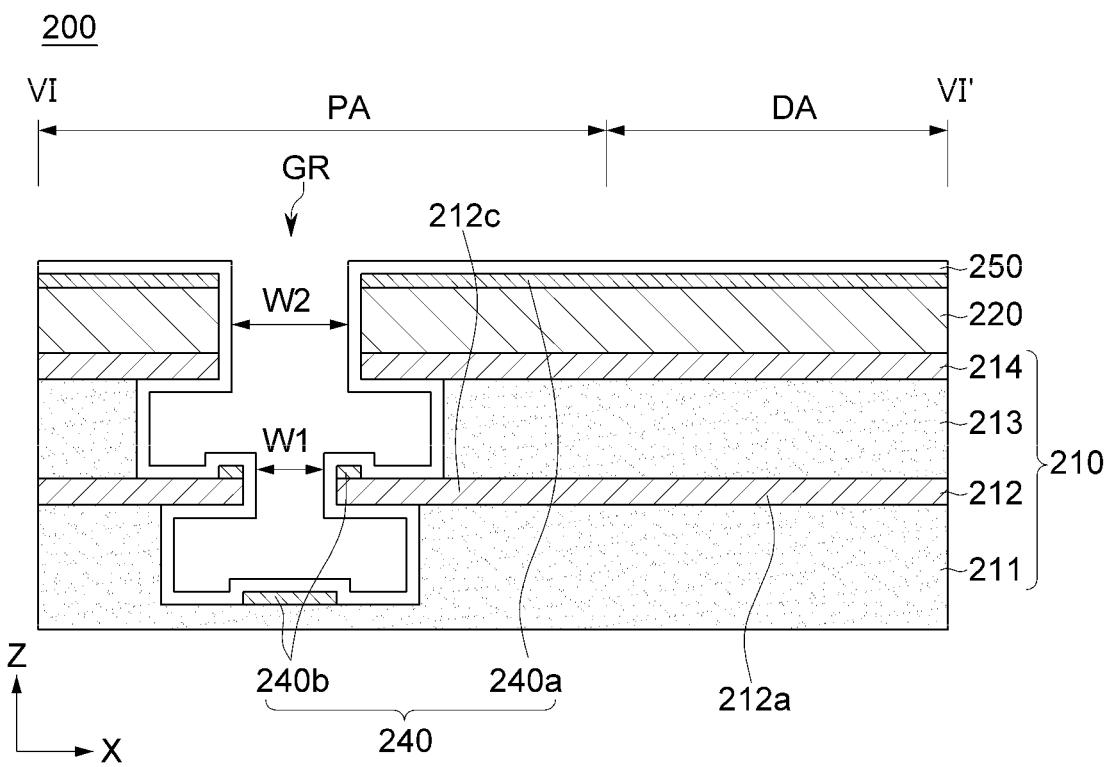
FIGS. 6A, 6B, 6C, and 6D are cross-sectional views illustrating OLED display devices according to an embodiment.
Figure 6B:
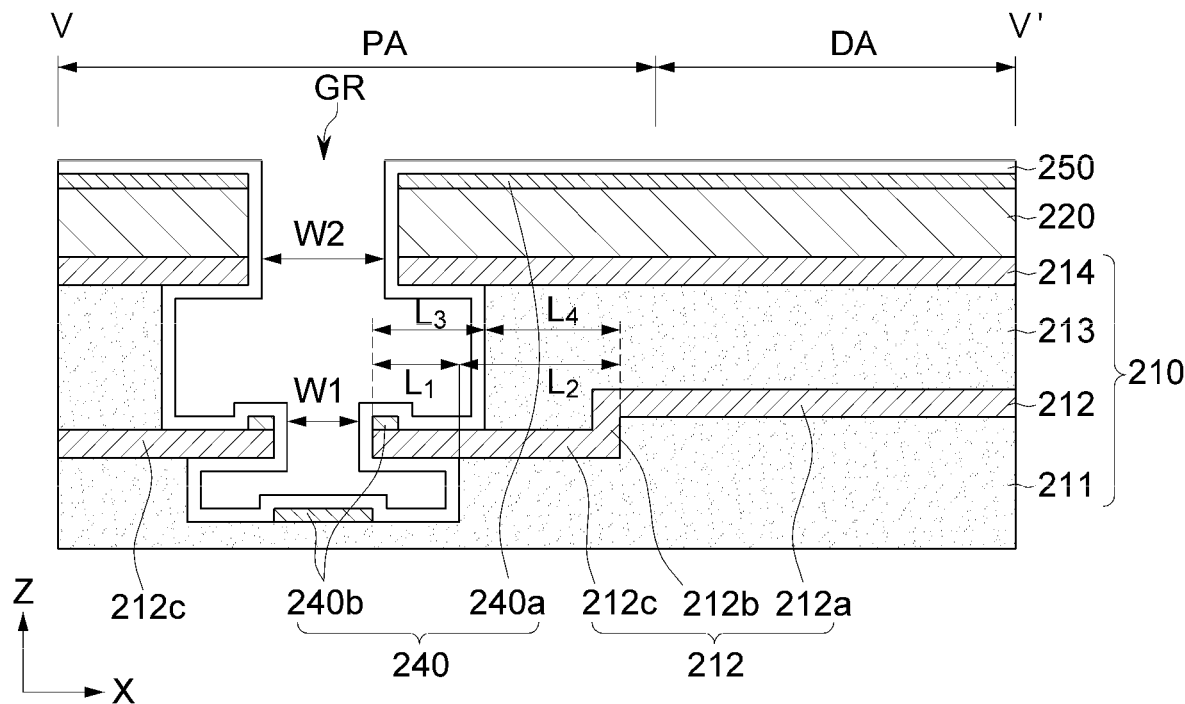
Figure 6C:
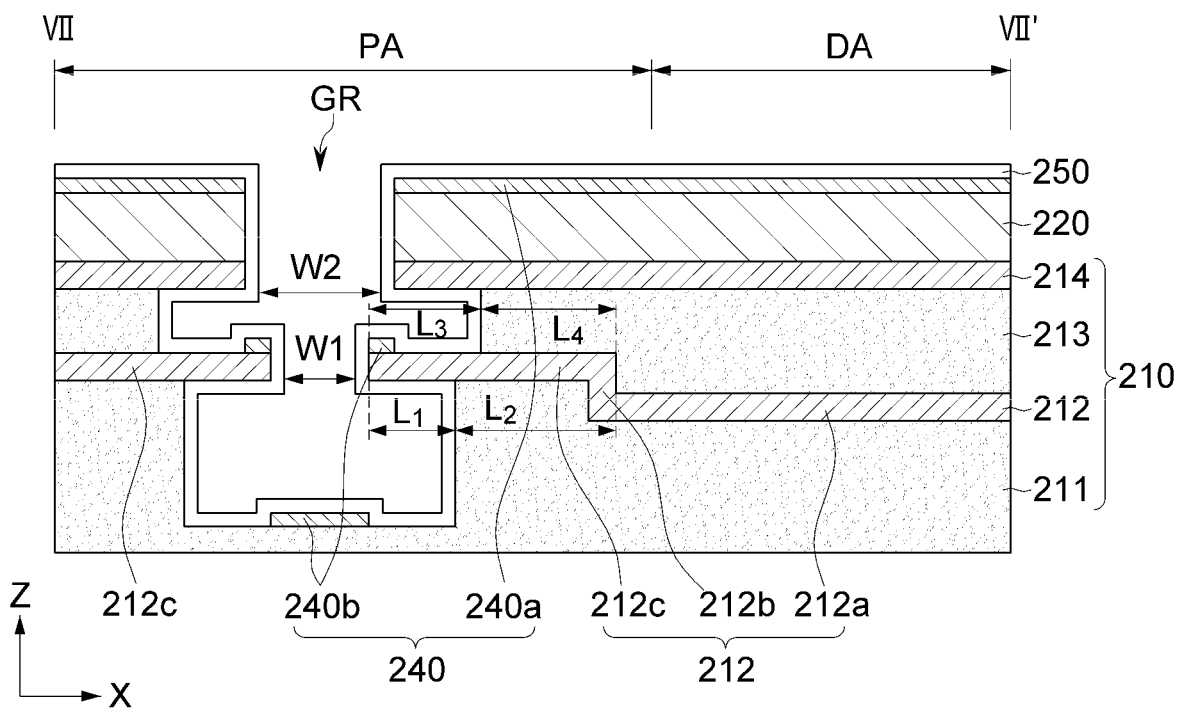
Figure 6D:
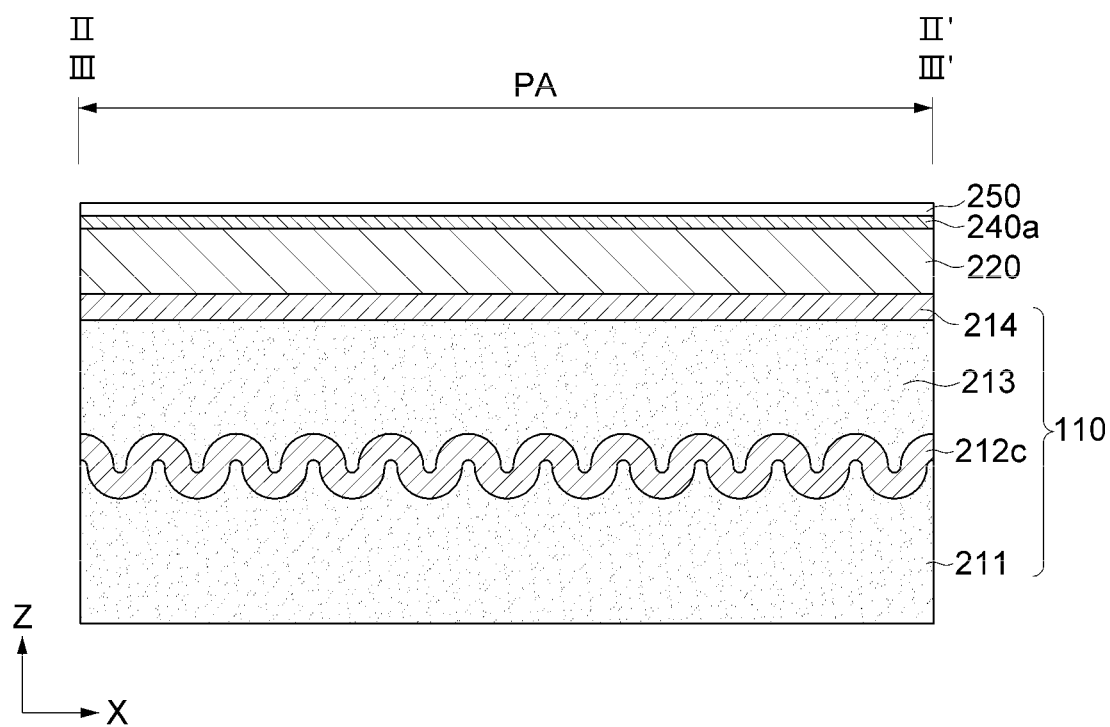

FIGS. 6A, 6B, and 6C are enlarged cross-sectional views of area B of FIG. 3 taken along line I-I' in the radial direction of FIG. 1A. In specific, FIG. 6A is a cross-sectional view taken along line IV-IV' of FIG. 4A or VI-VI' of FIG. 4B. FIG. 6B is a cross-sectional view taken along line V-V' of FIG. 4A. FIG. 6C is a cross-sectional view taken along line VII-VII' of FIG. 4B. FIG. 6D is a cross-sectional view taken along line II-II' or III-III' in the circumferential direction of FIG. 2.

The redundant description already given hereinabove with reference to FIGS. 5A to 5D will be omitted in the description of FIGS. 6A to 6D.

A description common to FIGS. 6A to 6D will be given first. An OLED display device 200 according to an embodiment may include a flexible substrate 210, a substructure 220, a common layer 240, and a sealing member 250.

The flexible substrate 210 may include a first substrate layer 211, a first barrier layer 212, a second substrate layer 213, and a second barrier layer 214. The first substrate layer 211 may include a first glass layer 211 and the second substrate layer 213 may include a second glass layer 213. The first barrier layer 212 has a waveform illustrated in FIG. 4A or 4B.

The second substrate layer 213 may include one or more plastic material of polyimide (PI), polyethylene naphthalate (PEN), polyethylene terephthalate (PET), polyarylate, polycarbonate (PC), polyetherimide (PEI), and polyethersulfone (PES), which are excellent in heat resistance and durability.

The second barrier layer 214 may be disposed on the second substrate layer 213. The second barrier layer 214 may include an inorganic material, for example, silicon oxide, silicon nitride and amorphous silicon. It may be suitable that a moisture permeability of the second barrier layer 214 be substantially equal to or less than about $10^{-5}$ g/m$^2$×day.

As described above, the first barrier layer 212 adjacent to the groove GR has a waveform of which a height changes in the circumferential direction (length direction), and has a straight line shape in the radial direction (thickness direction). The second barrier layer 214 is planar at both the display area DA and the peripheral area PA The groove GR may be defined at the flexible substrate 210. The groove GR may have a shape corresponding to the entirety of a thickness of the second barrier layer 214, the entirety of a thickness of the second substrate layer 213, the entirety of a thickness of the first barrier layer 212, and a part of a thickness of the first substrate layer 211.

The groove GR may have an undercut shape. For example, at the groove GR, the second substrate layer 213 may be undercut with respect to the second barrier layer 214. In other words, at the groove GR, the second barrier layer 214 may protrude as compared to the second substrate layer 213. Accordingly, a width of the groove GR at the second substrate layer 213 may be larger than a width W2 of the groove GR at the second barrier layer 214.

A width of the groove GR may decrease overall from an upper portion of the flexible substrate 210 to a lower portion thereof. For example, the width W2 of the groove GR at the second barrier layer 214 may be larger than a width W1 of the groove GR at the first barrier layer 212. In addition, a width of the groove GR at the second substrate layer 213 may be larger than a width of the groove GR at the first substrate layer 211.

The substructure 220 may be disposed on the flexible substrate 210, and the common layer 240 may be disposed on the substructure 220. The substructure 220 will be described below with reference to FIG. 9. The common layer 240 may include an organic light emitting layer.

The common layer 240 may include a first portion 240a disposed outside the groove GR and a second portion 240b disposed in the groove GR. For example, the first portion 240a may be disposed on the second barrier layer 214 outside the groove GR. In addition, a portion of the second portion 240b may be disposed on the first barrier layer 212 in the groove GR, and a remaining portion of the second portion 240b may be disposed on the first substrate layer 211.

The sealing member 250 may cover an upper surface and a side surface of the first portion 240a of the common layer 240, an upper surface and a side surface of the second portion 240b of the common layer 240, an upper surface and a side surface of the first substrate layer 211 exposed by the groove GR, a bottom surface, a side surface, and an upper surface of the first barrier layer 212, having a waveform, which are exposed by the groove GR, a side surface of the second substrate layer 213, and a bottom surface and a side surface of the second barrier layer 214, having a planar shape, which are exposed by the groove GR.

Hereinafter, a structure of the first barrier layer 212 will be described in detail with reference to FIGS. 6A to 6D. As described above, FIGS. 6A and 6B are cross-sectional views taken along lines IV-IV' and V-V' of FIG. 4A, respectively. FIGS. 6A and 6C are cross-sectional views taken along lines VI-VI' and VII-VII' of FIG. 4B, respectively. FIG. 6D corresponds to both cross-sectional views of FIGS. 4A and 4B.

First, the first barrier layer 212 of the type illustrated in FIG. 4A will be described with reference to FIGS. 6A, 6B and 6D.

FIG. 6A is a cross-sectional view taken along a ridge of the first barrier layer 212, FIG. 6B is a cross-sectional view taken along a valley of the first barrier layer 212, and FIG. 6D is a cross-sectional view in a circumferential direction.

Referring to FIG. 6A, a first barrier layer 212c of the peripheral area PA corresponds to the ridge of a waveform, and is substantially equal in height to a first barrier layer 212a of the display area DA.

Referring to FIG. 6B, the first barrier layer 212c of the peripheral area PA corresponds to the valley of the waveform, and is lower in height than a first barrier layer 212a of the display area DA that is planar. A first intermediate barrier layer 212b connects the first barrier layer 212c of the peripheral area PA and the first barrier layer 212a of the display area DA. The first intermediate barrier layer 212c may extend downward from the first barrier layer 212a of the display area DA. The second substrate layer 213 is disposed on a portion of the first barrier layer 212c of the peripheral area PA that has a waveform, the first intermediate barrier layer 212b, and the first barrier layer 212a of the display area DA that is planar. An upper surface of the second substrate layer 213 on the first barrier layer 212c that has a waveform is planar, and accordingly, the second barrier layer 214 may be planar.

The intermediate barrier layer 212b is disposed on the opposite side of the through hole TH with respect to the groove GR. A portion of a bottom surface of the barrier layer 212c that has a waveform is undercut and contacts the sealing member 250, and a remaining portion of the bottom surface of the barrier layer 212c that has a waveform contacts the first substrate layer 211. In the radial direction, a length L1 of the portion of the bottom surface that contacts the sealing member 250 may be substantially equal to or less than a length L2 of the portion of the bottom surface that contacts the first substrate layer 211.

A portion of an upper surface of the barrier layer 212c that has a waveform is undercut (exposed) and contacts the common layer 240b and the sealing member 250, and a remaining portion of the upper surface of the barrier layer 212c that has a waveform contacts the second substrate layer 213. In the radial direction, a length L3 of the portion of the upper surface that contacts the common layer 240b and the sealing member 250 may be substantially equal to or less than a length L4 of the portion of the upper surface that contacts the second substrate layer 213.

Referring to FIG. 6D, the first barrier layer 212c of the peripheral area PA has a waveform of which a height changes in the circumferential direction. The second substrate layer 213 disposed on the first barrier layer 212c of the peripheral area PA may have a planar upper surface. That is, the second substrate layer 213 may be planarized, and thus the second barrier layer 214 and the common layer 240a disposed on the second substrate layer 213 may be planar layers having no waveform. However, embodiments are not limited thereto, and similar to the first barrier layer 212c, the second barrier layer 214 may have a waveform.

A ratio of a height difference between the valley and the ridge of the first barrier layer 212c of the peripheral area PA with respect to a distance between adjacent valleys (or adjacent ridges) of the first barrier layer 212c has a predetermined value. The ratio of the height difference between the valley and the ridge with respect to the distance between adjacent valleys thereof (or adjacent ridges thereof) may be in a range from about 1/5 to about 5, and more suitably, from about 1/2 to about 2.

Referring still to FIG. 6D, the waveform of the first barrier layer 212c at the peripheral area PA is a curved line as a sin function. However, embodiments are not limited thereto, and the waveform of the first barrier layer 212c may be triangular, quadrangular, and trapezoidal, for example.

Next, the first barrier layer 212 of the type illustrated in FIG. 4B will be described with reference to FIGS. 6A, 6C, and 6D.

FIG. 6A is a cross-sectional view taken along a valley of the first barrier layer 212, FIG. 6C is a cross-sectional view taken along a ridge of the first barrier layer 212, and FIG. 6D is a cross-sectional view in a circumferential direction.

Referring to FIG. 6A, the first barrier layer 212c of the peripheral area PA corresponds to the valley of the waveform, and is substantially equal in height to the first barrier layer 212a of the display area DA.

Referring to FIG. 6C, the first barrier layer 212c of the peripheral area PA corresponds to the ridge of the waveform, and is higher in height than the first barrier layer 212a of the display area DA. The first intermediate barrier layer 212b connects the first barrier layer 212c of the peripheral area PA and the first barrier layer 212a of the display area DA. The first intermediate barrier layer 212b may extend upward from the first barrier layer 212a of the display area DA. The second substrate layer 213 disposed on the first barrier layer 212c of the peripheral area PA may have a planar upper surface. That is, the second substrate layer 213 may be planarized, and thus the second barrier layer 214 and the common layer 240a disposed on the second substrate layer 213 may be planar layers having no waveform. The position of the first intermediate barrier layer 212b is as in the description of FIG. 6C.

Referring to FIG. 6D, the waveform of the first barrier layer 212c at the peripheral area PA is as in the description given above, and thus will be omitted.

Hereinafter, a cross-sectional structure of an OLED display device according to an embodiment will be described in detail with reference to FIGS. 7A to 7D.

Figure 7A:
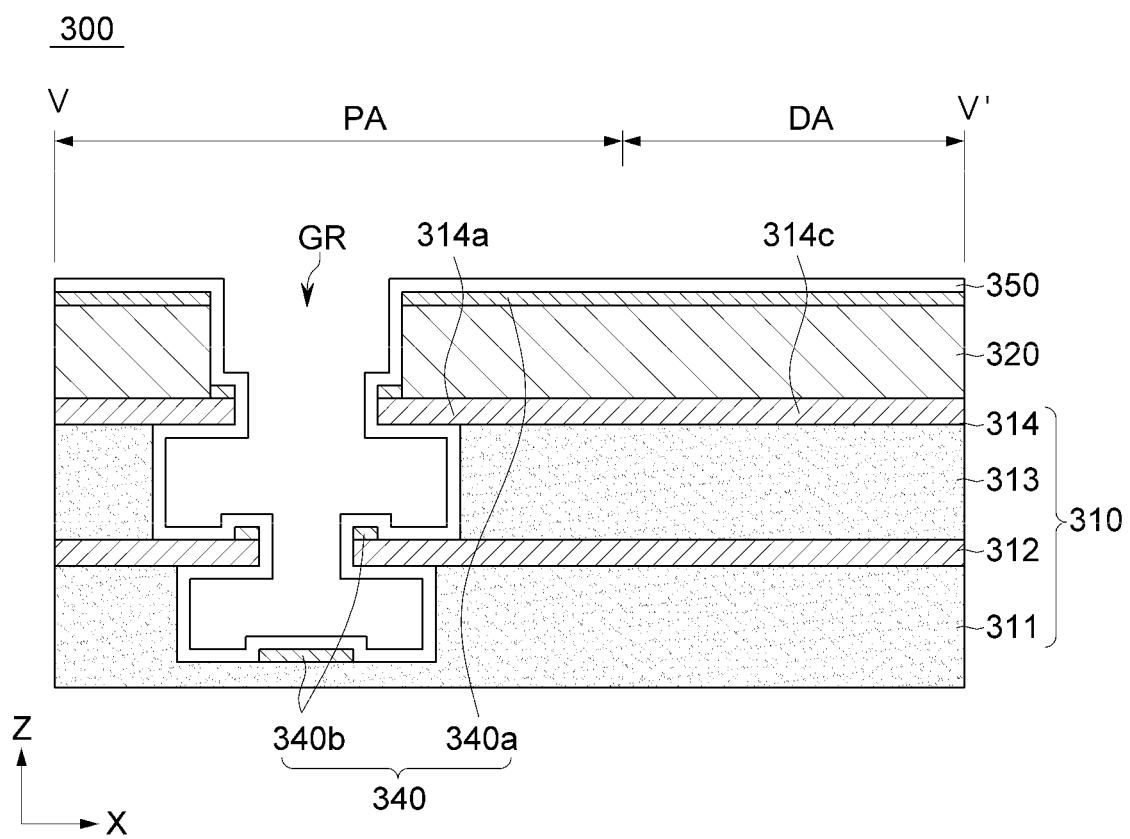
FIGS. 7A, 7B, 7C, and 7D are cross-sectional views illustrating OLED display devices according to an embodiment.
Figure 7B:
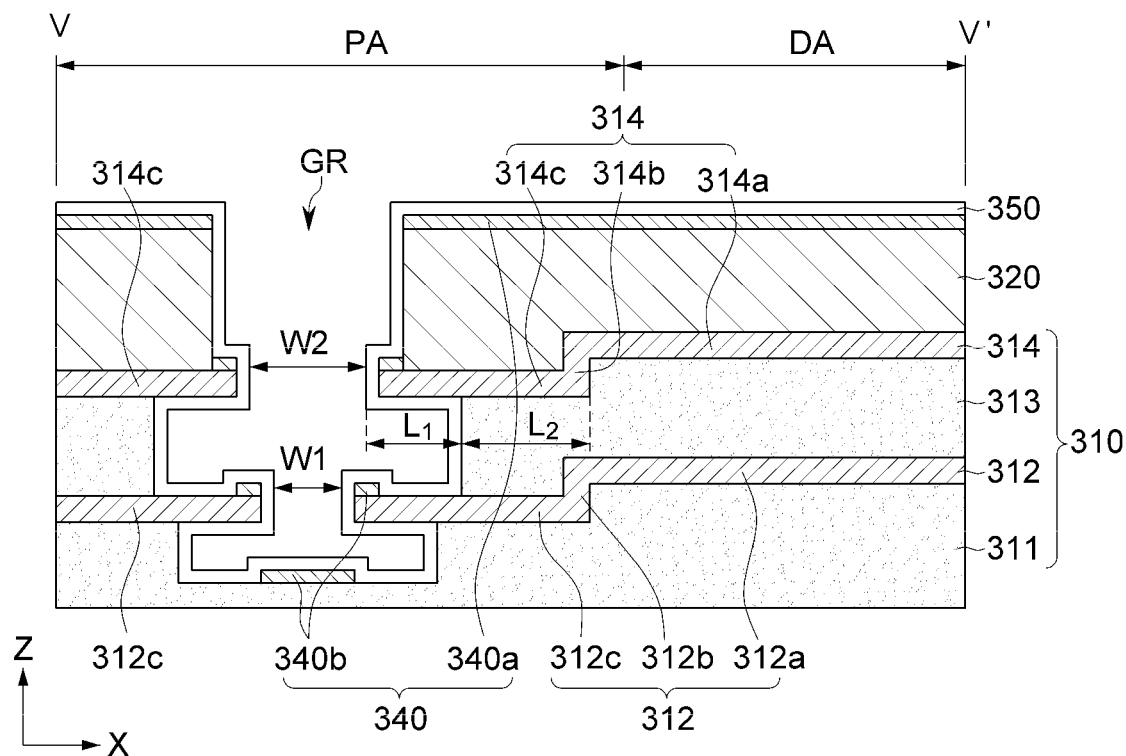
Figure 7C:
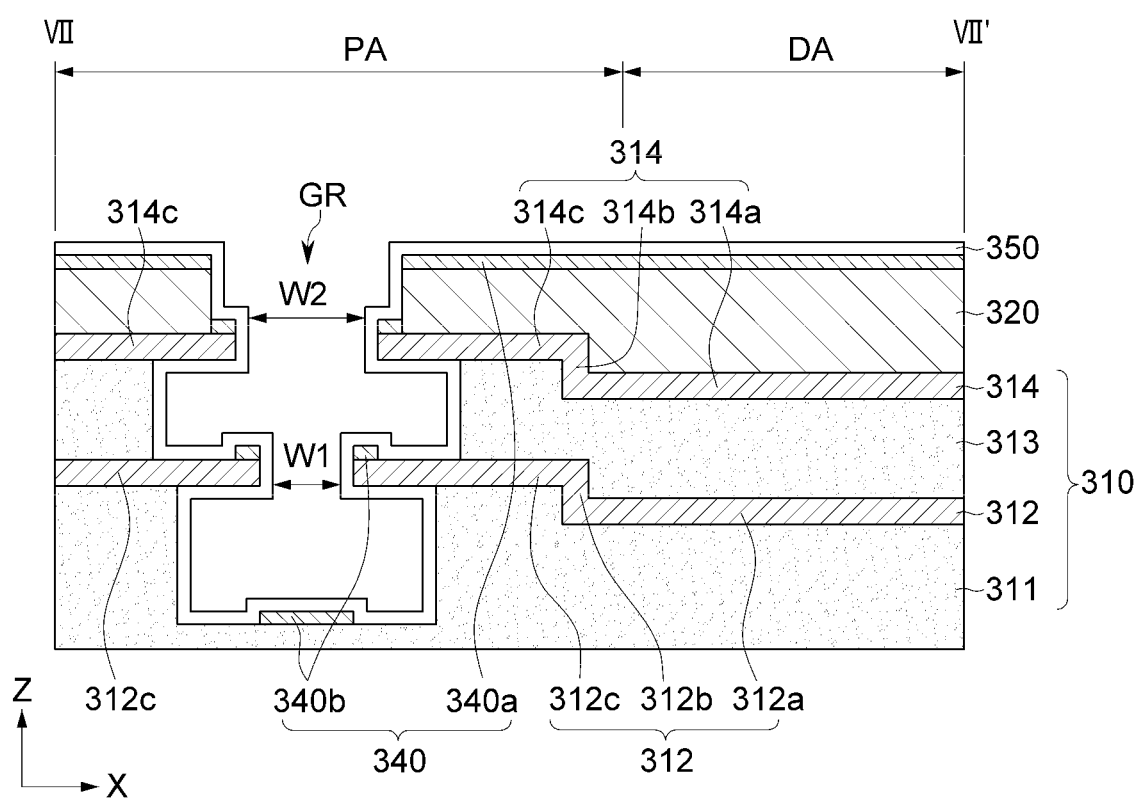
Figure 7D:
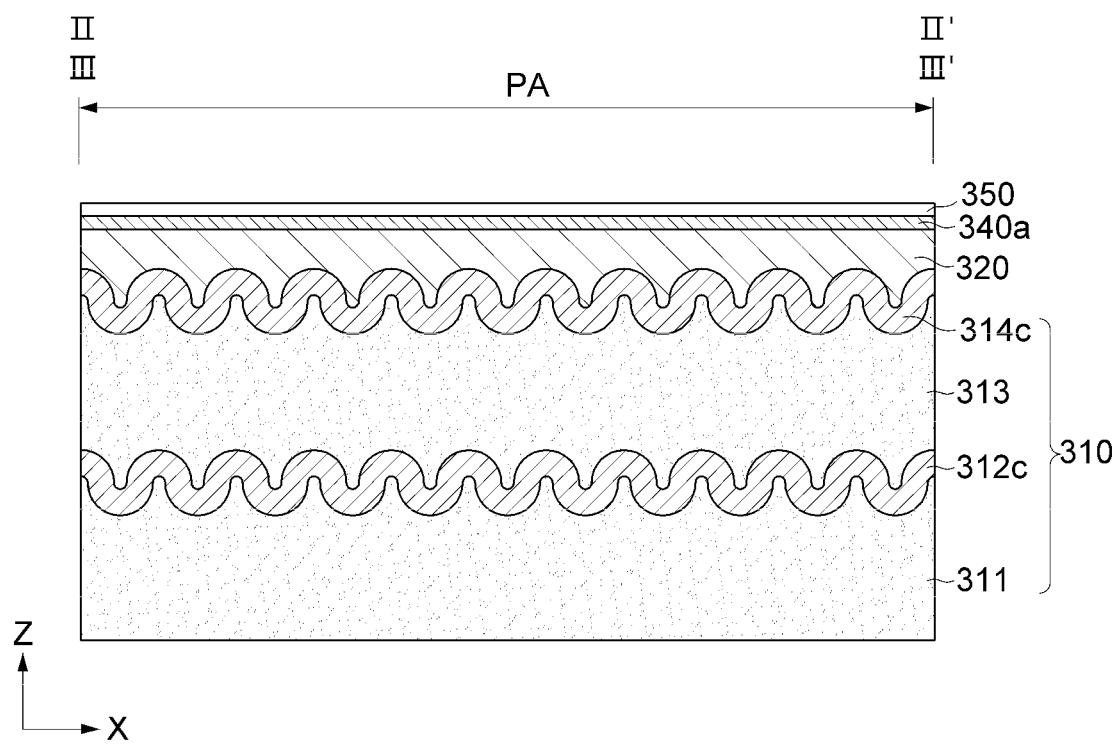

FIGS. 7A, 7B, and 7C are enlarged cross-sectional views of area B of FIG. 3 taken along line I-I' in the radial direction of FIG. 1A. In specific, FIG. 7A is a cross-sectional view taken along line IV-IV' of FIG. 4A or VI-VI' of FIG. 4B. FIG. 7B is a cross-sectional view taken along line V-V' of FIG. 4A. FIG. 7C is a cross-sectional view taken along line VII-VII' of FIG. 4B. FIG. 7D is a cross-sectional view taken along line II-II' or III-III' in the circumferential direction of FIG. 2.

The redundant description given hereinabove with reference to FIGS. 6A to 6D will be omitted from the description of FIGS. 7A to 7D.

A description common to FIGS. 7A to 7D will be given first. Referring to FIGS. 7A to 7D, an OLED display device 300 according to an embodiment may include a flexible substrate 310, a substructure 320, a common layer 340, and a sealing member 350.

The substructure 320 may be disposed between the flexible substrate 310 and the common layer 340. A groove GR may be defined at the substructure 320 and the flexible substrate 310. The groove GR may have a shape corresponding to the entirety of a thickness of the substructure 320, the entirety of a thickness of a second barrier layer 314, the entirety of a thickness of a second substrate layer 313, the entirety of a thickness of a first barrier layer 312, and a part of a thickness of a first substrate layer 311.

The substructure 320 may include a plurality of inorganic layers. The specific structure of the substructure 320 will be described in detail below with reference to FIGS. 9 and 10.

The common layer 340 may include a first portion 340a disposed outside the groove GR and a second portion 340b disposed in the groove GR. For example, the first portion 340a may be disposed on the substructure 320 outside the groove GR. In addition, a portion of the second portion 340b may be disposed on the second barrier layer 314 in the groove GR, another portion of the second portion 340b may be disposed on the first barrier layer 312 in the groove GR, and a remaining portion of the second portion 340b may be disposed on the first substrate layer 311.

The sealing member 350 may cover an upper surface and a side surface of the first portion 340a of the common layer 340, an upper surface and a side surface of the second portion 340b of the common layer 340, an upper surface and a side surface of the first substrate layer 311 exposed by the groove GR, a bottom surface, a side surface, and an upper surface of the first barrier layer 312, having a waveform, which are exposed by the groove GR, a side surface of the second substrate layer 313, a bottom surface and a side surface of the second barrier layer 314, having a waveform, which are exposed by the groove GR, and a side surface of the substructure 320.

Hereinafter, a structure of the second barrier layer 314 will be described in detail with reference to FIGS. 7A to 7D. Since a structure of the first barrier layer 312 is substantially the same as that of the first barrier layer 212 described with reference to FIGS. 6A to 6D, detailed description thereof will be omitted. FIGS. 7A and 7B are cross-sectional views taken along lines IV-IV' and V-V' of FIG. 4A, respectively. FIGS. 7A and 7C are cross-sectional views taken along lines VI-VI' and VII-VII' of FIG. 4B, respectively. FIG. 7D corresponds to both cross-sectional views of FIGS. 4A and 4B.

First, the first barrier layer 312 and the second barrier layer 314 of the type illustrated in FIG. 4A will be described with reference to FIGS. 7A, 7B and 7D.

FIG. 7A is a cross-sectional view taken along ridges of the first barrier layer 312 and the second barrier layer 314. FIG. 7B is a cross-sectional view taken along valleys thereof. FIG. 7D is a cross-sectional view in a circumferential direction. The valleys and ridges of the first barrier layer 312 and the second barrier layer 314 may be parallel to each other. However, embodiments are not limited thereto, and the valleys and ridges of the first barrier layer 312 and the second barrier layer 314 may be located in a non-aligned manner with each other (i.e., they may not be parallel to each other).

Referring to FIG. 7A, a second barrier layer 314c of the peripheral area PA corresponds to the ridge of the waveform, and is substantially equal in height to a second barrier layer 314a of the display area DA.

Referring to FIG. 7B, the second barrier layer 314c of the peripheral area PA corresponds to the valley of the waveform, and is lower in height than the second barrier layer 314a of the display area DA. A second intermediate barrier layer 314b connects the second barrier layer 314c of the peripheral area PA and the second barrier layer 314a of the display area DA. The second intermediate barrier layer 314b may extend downward from the second barrier layer 314a of the display area DA.

The second intermediate barrier layer 314b is located inside (opposite to the groove GR) with respect to a border between the second substrate layer 313 and the groove GR. That is, a portion of a bottom surface of the second barrier layer 314c that has a waveform is undercut and contacts the sealing member 350, and a remaining portion of a bottom surface of the second barrier layer 314c that has a waveform contacts the second substrate layer 313. In the radial direction, a length L1 of a portion of the bottom surface that contacts the sealing member 350 may be substantially equal to or less than a length L2 of a portion of the bottom surface that contacts the second substrate layer 313.

In addition, a second intermediate barrier layer 312b is disposed on the opposite side of a through hole TH with respect to the groove GR. A portion of a bottom surface of a barrier layer 312c that has a waveform is undercut and contacts the sealing member 350, and a remaining portion of the bottom surface of the barrier layer 312c that has a waveform contacts the first substrate layer 311. In the radial direction, a length of a portion of the bottom surface that contacts the sealing member 350 may be substantially equal to or less than a length of a portion of the bottom surface that contacts the first substrate layer 311.

A portion of an upper surface of the second barrier layer 314c that has a waveform contacts the common layer 340b, and a remaining portion of the upper surface of the second barrier layer 314c that has a waveform contacts the substructure 320.

Referring to FIG. 7D, the first barrier layer 312c and the second barrier layer 314c of the peripheral area PA have a waveform of which heights change in the circumferential direction. The substructure 320 disposed on the second barrier layer 314c of the peripheral area PA may have a planar upper surface. That is, the substructure 320 may be planarized, and thus the common layer 340a disposed on the substructure 320 may be planar layers having no waveform.

Referring to FIG. 7D, the waveform of the second barrier layer 314c at the peripheral area PA is substantially the same as the first barrier layers 112c and 212c described hereinabove with reference to FIGS. 5D and 6D, and thus will not be described.

Next, the second barrier layer 314 of the type illustrated in FIG. 4B will be described with reference to FIGS. 7A, 7C, and 7D.

FIG. 7A is a cross-sectional view taken along a valley of the second barrier layer 314, FIG. 7C is a cross-sectional view taken along a ridge of the second barrier layer 314, and FIG. 7D is a cross-sectional view in a direction perpendicular to the directions thereof.

Referring to FIG. 7A, the second barrier layer 314a of the peripheral area PA corresponds to the valley of the waveform, and is substantially equal in height to the second barrier layer 314c of the display area DA.

Referring to FIG. 7C, the second barrier layer 314c of the peripheral area PA corresponds to the ridge of the waveform, and is higher in height than the second barrier layer 314a of the display area DA. The second intermediate barrier layer 314b connects the second barrier layer 314c of the peripheral area PA and the second barrier layer 314a of the display area DA. The second intermediate barrier layer 314b may extend upward from the second barrier layer 314a of the display area DA. The substructure 320 disposed on the second barrier layer 314c of the peripheral area PA may have a planar upper surface. A position of the second intermediate barrier layer 314b is as described hereinabove with reference to FIG. 7B.

Referring to FIG. 7D, the waveform of the second barrier layer 314c at the peripheral area PA is as described above, and thus will not be described.

Hereinabove, the OLED display device including the first barrier layer 312 and the second barrier layer 314 each having a waveform has been described. However, embodiments are not limited thereto, and the first barrier layer 312 adjacent to the groove GR may have no waveform, that is, planar, and only the second barrier layer 314 may have a waveform.

Hereinafter, a cross-sectional structure of an OLED display device according to an embodiment will be described in detail with reference to FIG. 8.

Figure 8:
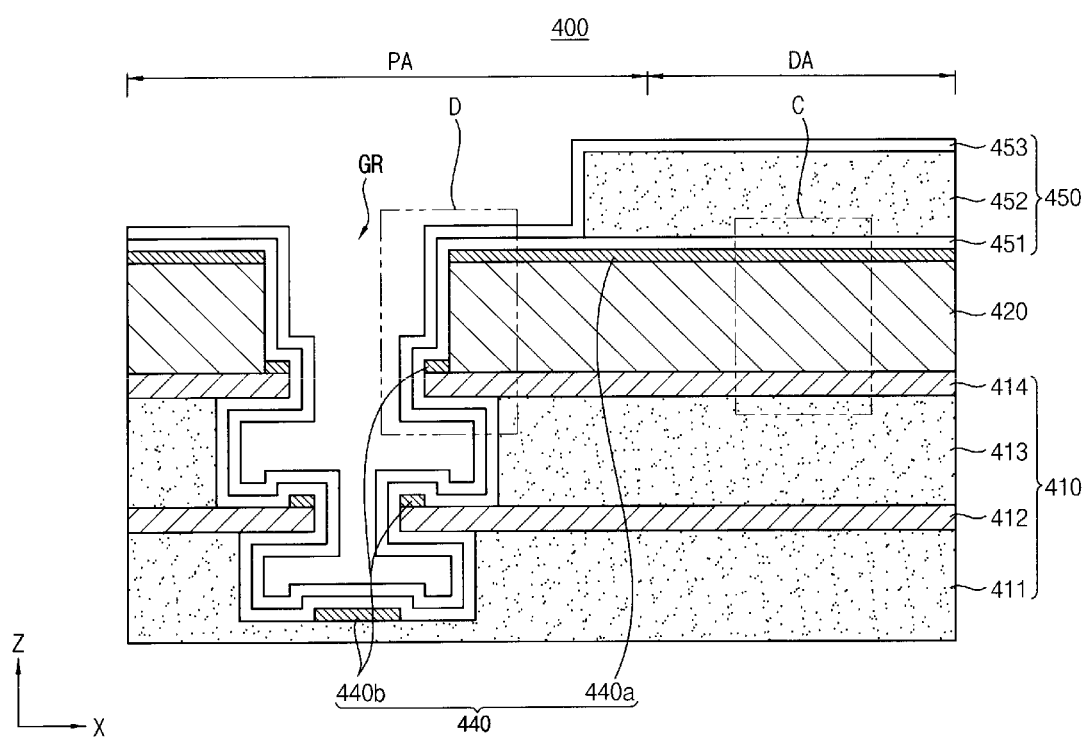
FIG. 8 is a cross-sectional view illustrating an OLED display device according to an embodiment.

FIG. 8 is a cross-sectional view illustrating an OLED display device according to an embodiment.

An embodiment illustrated in FIG. 8 is substantially the same as that of an embodiment illustrated in FIG. 7A, except for the configuration of a sealing member, so repeated description will be omitted.

Referring to FIG. 8, an OLED display device 400 according to an embodiment may include a flexible substrate 410, a substructure 420, a common layer 440, and a sealing member 450.

The sealing member 450 may include at least one inorganic layer and at least one organic layer. For example, the sealing member 450 may include a first inorganic layer 451, an organic layer 452, and a second inorganic layer 453.

The first inorganic layer 451 may be disposed on the common layer 440. The second inorganic layer 453 may be disposed on the first inorganic layer 451. Each of the first inorganic layer 451 and the second inorganic layer 453 may include an inorganic material such as aluminum oxide, silicon oxide, silicon nitride, silicon oxynitride, silicon carbide, titanium oxide, zirconium oxide, zinc oxide and the like.

The organic layer 452 may be disposed between the first inorganic layer 451 and the second inorganic layer 453. The organic layer 452 may include an organic material such as epoxy, polyimide (PI), polyethylene terephthalate (PET), polycarbonate (PC), polyethylene (PE), polyacrylate.

At least one inorganic layer of the sealing member 450 may cover a surface of the flexible substrate 410 that is exposed by the groove GR. For example, the first inorganic layer 451 and the second inorganic layer 453 may extend from the outside of the groove GR to the inside of the groove GR along a shape of the groove GR. In such an exemplary embodiment, the first inorganic layer 451 may cover a surface of a first substrate layer 411, a surface of a first barrier layer 412 (having or not having a waveform), a surface of a second substrate layer 413, a surface of a second barrier layer 414 (having or not having a waveform), a surface of a second portion 440b of the common layer 440, and a surface of the substructure 420 that are exposed by the groove GR along the shape of the groove GR. In addition, the second inorganic layer 453 may cover the first inorganic layer 451 along the shape of the first inorganic layer 451.

At least one organic layer of the sealing member 450 may be disposed outside the groove GR. In other words, the at least one organic layer may not be disposed in the groove GR. For example, the organic layer 452 may be disposed only on the outside of the groove GR in a selective manner.

Hereinafter, the substructure 420 and the common layer 440 of the display area DA and the peripheral area PA will be described in detail with reference to FIGS. 9 and 10.

Figure 9:
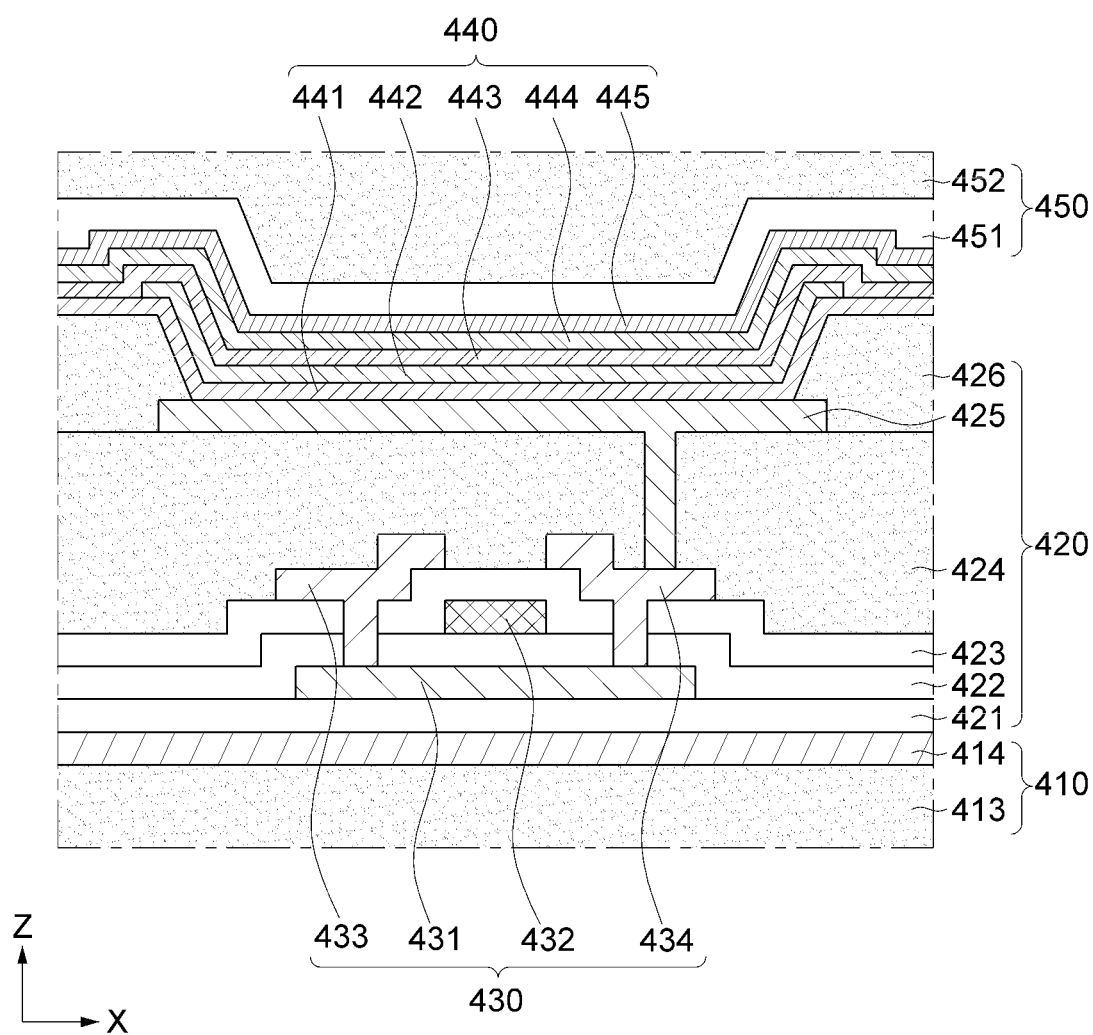
FIG. 9 is a cross-sectional view illustrating area C in FIG. 8.

FIG. 9 is a cross-sectional view illustrating area C in FIG. 8. FIG. 10 is a cross-sectional view illustrating area D in FIG. 8. For example, FIG. 9 may represent one pixel of the OLED display device.

Figure 10:
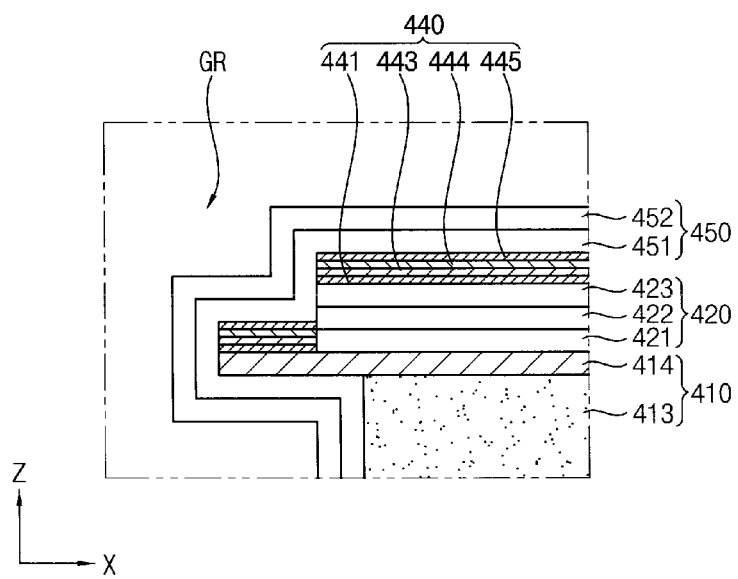
FIG. 10 is a cross-sectional view illustrating area D in FIG. 8.

Referring to FIGS. 9 and 10, the OLED display device 400 according to an embodiment may include the flexible substrate 410, the substructure 420, a thin film transistor 430, the common layer 440, and the sealing member 450.

The substructure 420 may include a buffer layer 421, a gate insulating layer 422, an insulating interlayer 423, a planarization layer 424, a pixel electrode 425, and a pixel defining layer 426. The thin film transistor 430 may include an active pattern 431, a gate electrode 432, a source electrode 433, and a drain electrode 434.

The buffer layer 421 may be disposed on the flexible substrate 410. The buffer layer 421 may substantially block or reduce the penetration of foreign matter, moisture, or external air from below the flexible substrate 410. In addition, the buffer layer 421 may provide a planar surface on the flexible substrate 410.

The active pattern 431 may be disposed on the buffer layer 421. The active pattern 431 may comprise a semiconductor material such as amorphous silicon and polycrystalline silicon. However, embodiments are not limited thereto, and the active pattern 431 may include various materials. The active pattern 431 may selectively include an oxide semiconductor material and an organic semiconductor material, for example.

The gate insulating layer 422 that covers the active pattern 431 may be disposed on the buffer layer 421. The gate insulating layer 422 may insulate the gate electrode 432 from the active pattern 431.

The gate electrode 432 may be disposed on the gate insulating layer 422. The gate electrode 432 may overlap a part of the active pattern 431. The gate electrode 432 may include a conductive material such as molybdenum (Mo), aluminum (Al), copper (Cu), and titanium (Ti)

The insulating interlayer 423 that covers the gate electrode 432 may be disposed on the gate insulating layer 422. The insulating interlayer 423 may insulate the source electrode 433 and the drain electrode 434 from the gate electrode 432.

Each of the buffer layer 421, the gate insulating layer 422 and the insulating interlayer 423 may include an inorganic material such as aluminum oxide, silicon oxide, silicon nitride, silicon oxynitride, silicon carbide, titanium oxide, and zirconium oxide. The buffer layer 421, the gate insulating layer 422, and the insulating interlayer 423 may extend from the display area DA to the peripheral area PA. Edges of the buffer layer 421, the gate insulating layer 422, and the insulating interlayer 423 may be adjacent to the groove GR.

In an embodiment, the edges of the buffer layer 421, the gate insulating layer 422 and the insulating interlayer 423 may be spaced from an edge of the second barrier layer 414 of the flexible substrate 410. In other words, at the groove GR, the second barrier layer 414 may protrude further as compared to the buffer layer 421, the gate insulating layer 422, and the insulating interlayer 423.

The source electrode 433 and the drain electrode 434 may be disposed on the insulating interlayer 423. The source electrode 433 and the drain electrode 434 may be electrically connected to the active pattern 431. For example, a first contact hole that exposes a first area of the active pattern 431 and a second contact hole that exposes a second area of the active pattern 431 are defined at the gate insulating layer 422 and the insulating interlayer 423, and the source electrode 433 and the drain electrode 434 may contact the active pattern 431 through the first contact hole and the second contact hole, respectively. The source electrode 433 and the drain electrode 434 may include various conductive materials.

The planarization layer 424 that covers the source electrode 433 and the drain electrode 434 may be disposed on the insulating interlayer 423. The planarization layer 424 may eliminate a step difference that may be caused by the thin film transistor 430, and provide a planar surface on the top of the thin film transistor 430. In addition, the planarization layer 424 may protect the source electrode 433 and the drain electrode 434.

An OLED may be disposed on the planarization layer 424. The OLED may include a pixel electrode 425, an organic light emitting layer 442, and a common electrode 444.

The pixel electrode 425 may be disposed on the planarization layer 424. The pixel electrode 425 may be electrically connected to the drain electrode 434. For example, a third contact hole that exposes the drain electrode 434 may be defined at the planarization layer 424, and the pixel electrode 425 may contact the drain electrode 434 through the third contact hole. The pixel electrode 425 may include various conductive materials. The pixel electrode 425 may have various shapes. For example, the pixel electrode 425 may be patterned corresponding to each pixel and have an island shape.

The pixel defining layer 426 that covers the pixel electrode 425 may be disposed on the planarization layer 424. The pixel defining layer 426 may have an opening that exposes a portion of the pixel electrode 425.

Each of the planarization layer 424 and the pixel defining layer 426 may include an organic material. The planarization layer 424 and the pixel defining layer 426 may be disposed at the display area DA in a selective manner, and may not extend to the peripheral area PA.

The organic light emitting layer 442 may be disposed on the pixel electrode 425. The organic light emitting layer 442 may include a low molecular organic material or a polymer organic material such as poly 3,4-ethylenedioxythiophene (PEDOT). The organic light emitting layer 442 may be formed separately corresponding to each pixel.

The common electrode 444 may be disposed on the organic light emitting layer 442. The common electrode 444 may also be disposed on the pixel defining layer 426 over a plurality of pixels.

The OLED may further include a first organic functional layer 441 and a second organic functional layer 443. The first organic functional layer 441 may be disposed between the pixel electrode 425 and the organic light emitting layer 442, and the second organic functional layer 443 may be disposed between the organic light emitting layer 442 and the common electrode 444.

The first organic functional layer 441 may include a hole injection layer (HIL) and/or a hole transporting layer (HTL). The second organic functional layer 443 may include an electron transporting layer (ETL) and/or an electron injection layer (EIL). The first organic functional layer 441 and the second organic functional layer 443 may be formed over the plurality of pixels.

A capping layer 445 may be disposed on the common electrode 444. The capping layer 445 may protect the common electrode 444 and improve luminous efficiency by controlling a refractive index of visible light emitted from the organic light emitting layer 442.

The first functional layer 441, the second functional layer 443, the common electrode 444, and the capping layer 445 may extend from the display area DA to the peripheral area PA. At least one of the first functional layer 441, the second functional layer 443, the common electrode 444, and the capping layer 445 may be disposed throughout the outside and inside of the groove GR in the peripheral area PA. Although it is illustrated in FIG. 9 that the common layer 440 that includes the first functional layer 441, the second functional layer 443, the common electrode 444, and the capping layer 445 are disposed throughout the outside and inside of the groove GR by way of example, embodiments are not limited thereto.

The sealing member 450 may be disposed on the capping layer 445.

Hereinafter, a method of manufacturing an OLED display device according to an embodiment will be described in detail with reference to FIGS. 11A to 11F.

FIGS. 11A to 11F are cross-sectional views illustrating a process of manufacturing an OLED display device according to an embodiment before defining a groove. FIGS. 11A to 11F are cross-sectional views illustrating the peripheral area PA taken in a circumferential direction, which correspond to II-II' or III-III' in FIG. 2.

Referring to FIGS. 11A to 11F, a carrier substrate 470 may be prepared and the flexible substrate 410 may be formed on the carrier substrate 470.

The flexible substrate 410 that includes a plastic material may be bent or elongated when heat is applied thereto, and it may be difficult to precisely form a thin film pattern such as an electrode or a conductive wire thereon. Accordingly, a process of forming a plurality of thin film patterns may be performed in a state in which the flexible substrate 410 is attached to the carrier substrate 470.

Figure 11A:
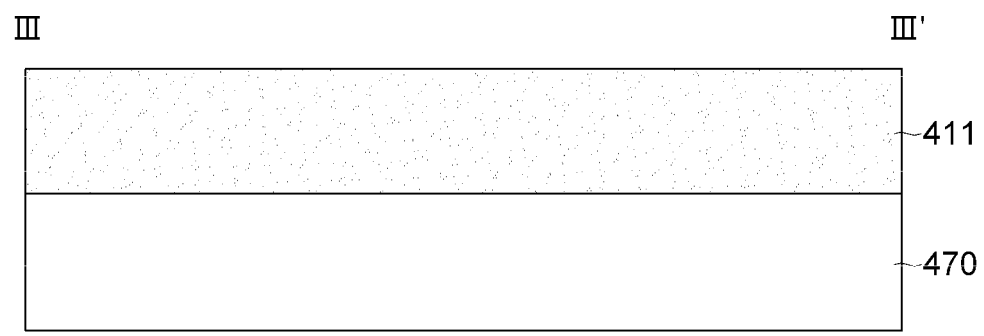
FIGS. 11A, 11B, 11C, 11D, 11E, and 11F are cross-sectional views illustrating a method of manufacturing an OLED display device according to an embodiment.

First, as illustrated in FIG. 11A, the first substrate layer 411 may be formed on the carrier substrate 470. The first substrate layer 411 may be formed by coating a plastic polymer solution on the carrier substrate 470 and then curing or by laminating a polymer film on the carrier substrate 470. For example, thermal curing, ultraviolet curing, and electron beam curing may be used as the curing method.

Figure 11B:
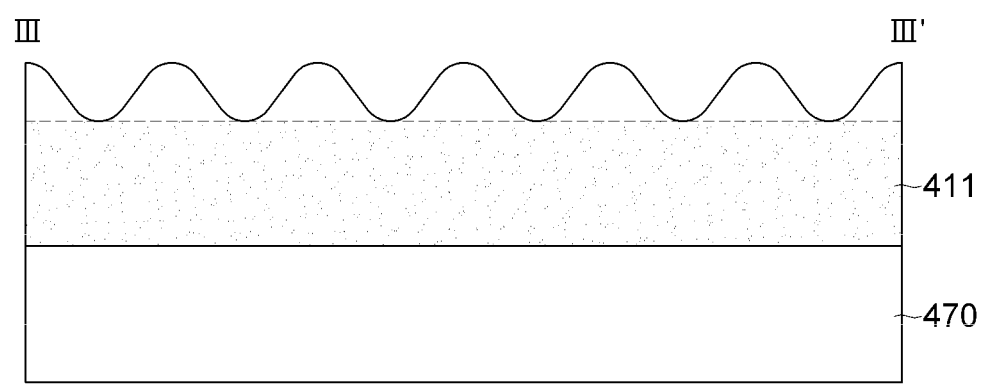
Figure 11C:
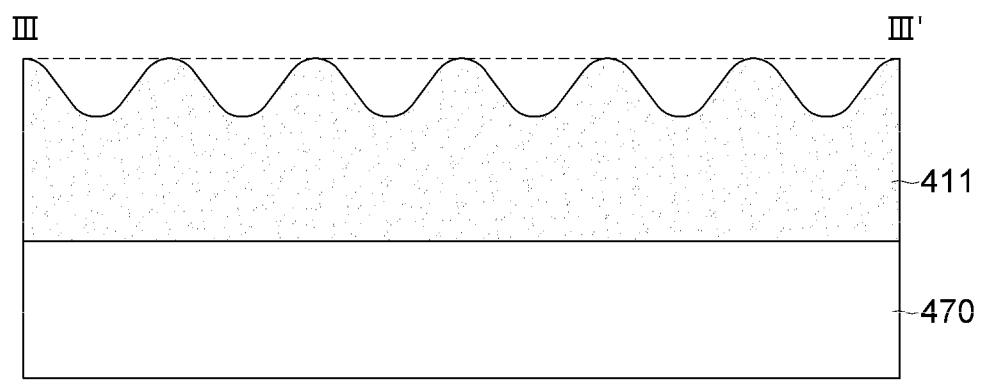

Then, a waveform corresponding to a shape of the barrier layer 112 of FIGS. 4A and 4B is formed on the first substrate layer, as illustrated in FIGS. 11B and 11C. For example, a waveform of which a height changes in the length direction of the groove and which has a straight line shape in the width direction of the groove is formed.

Referring to FIG. 11C, the waveform may be formed by partially etching an upper surface of the first substrate layer 411 using, for example, a mask pattern. For example, an area corresponding to a valley of the first barrier layer 412, e.g., the line of V-V' in FIG. 4A, is to be etched, and an area corresponding to a ridge of the first barrier layer 412 is not etched. Accordingly, the waveform formed on the first substrate layer 411 of the peripheral area PA is lower than the upper surface of the first substrate layer 411 of the display area DA.

Alternatively, referring to FIG. 11B, the waveform may be formed on the upper surface of the first substrate layer 411 through, for example, inkjet printing and nano-printing. For example, an area corresponding to the ridge of the first barrier layer 412, e.g., the line of VII-VII' in FIG. 4B is printed. Accordingly, the waveform formed on the first substrate layer 411 of the peripheral area PA is higher than the upper surface of the first substrate layer 411 of the display area DA.

Figure 11D:
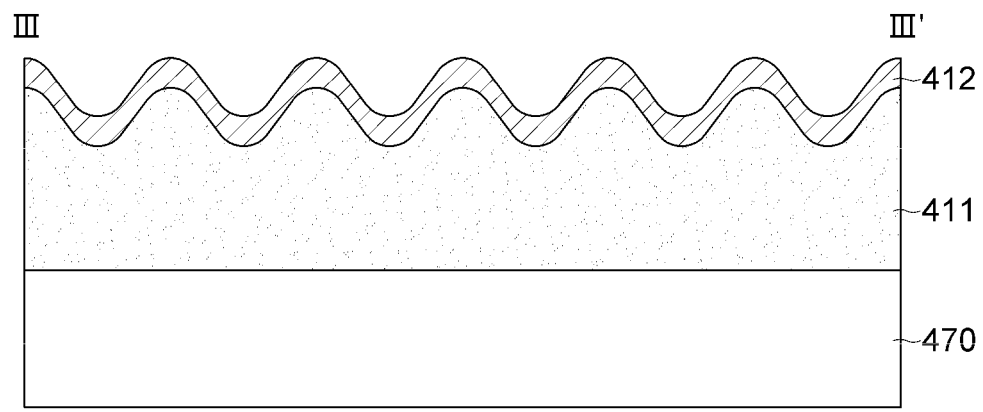

Referring to FIG. 11D, the first barrier layer 412 may be formed on the first substrate layer 411. The first barrier layer 412 may be formed using an inorganic material by a chemical vapor deposition method, a plasma chemical vapor deposition method, and an atomic layer deposition method, for example. As described hereinabove, since the first barrier layer 412 formed on the first substrate layer 411 of the peripheral area PA has a waveform, the first barrier layer 412 formed thereon has a shape corresponding to the shape of the first substrate layer 411.

Figure 11E:
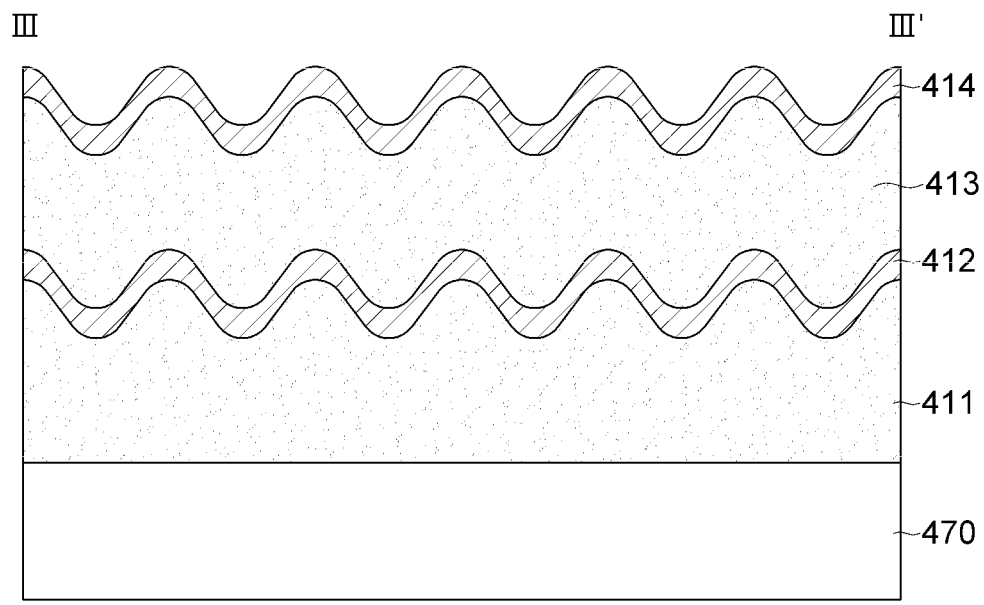

Referring to FIG. 11E, the second substrate layer 413 may be formed on the first barrier layer 412, and the second barrier layer 414 may be formed on the second substrate layer 413. The second substrate layer 413 and the first substrate layer 411 may include a substantially same material and may be formed in a substantially same method. The second barrier layer 414 and the first barrier layer 412 may include a substantially same material and may be formed in a substantially same method. Accordingly, the second barrier layer 414 of the peripheral area PA also has a waveform as the waveform of the first barrier layer 412. However, as illustrated in FIGS. 6A to 6D, the second barrier layer 414 may be a planar layer not having a waveform. In an alternative exemplary embodiment, the first barrier layer 412 may be a planar layer not having a waveform, and the second barrier layer 414 may have a waveform.

Figure 11F:
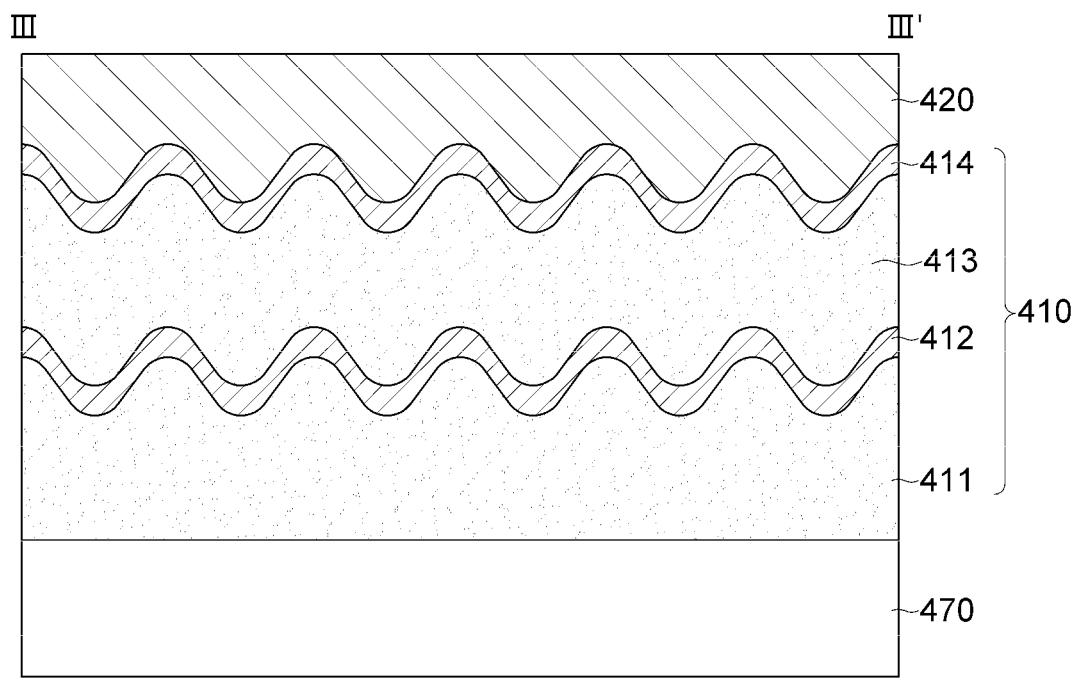

Referring to FIG. 11F, the substructure 420 may be formed on the flexible substrate 410. The active pattern 431 (see FIG. 9) may be formed in various methods depending on a material thereof. For example, when the active pattern 431 (see FIG. 9) includes, for example, amorphous silicon and an oxide semiconductor, the active pattern 431 may be formed by a plasma chemical vapor deposition, an atmospheric pressure chemical vapor deposition method, or a low pressure chemical vapor deposition, for example. In an exemplary embodiment, when the active pattern 431 (see FIG. 9) includes, for example, polycrystalline silicon, the active pattern 431 may be formed by crystallizing amorphous silicon in a rapid thermal annealing method, a solid phase crystallization method, an excimer laser annealing method, or a metal induced annealing method, for example.

The gate electrode 432 (see FIG. 9), the source electrode 433 (see FIG. 9), the drain electrode 434 (see FIG. 9), and the pixel electrode 425 (see FIG. 9) may be formed by performing deposition through, for example, a chemical vapor deposition method, a plasma chemical vapor deposition method, or an atomic layer deposition, and then patterning in a photolithography method, for example.

Hereinafter, a method of manufacturing an OLED display device according to an embodiment will be described in detail with reference to FIGS. 12A to 12H.

FIGS. 12A to 12H are cross-sectional views illustrating a method of manufacturing an OLED display device according to an embodiment. FIGS. 12A to 12H are cross-sectional views in a radial direction as illustrated in FIGS. 5A, 6A and 7A.

In specific, FIGS. 12A to 12H show a method of manufacturing the OLED display device 400 of FIG. 8. The present embodiment illustrates a method of manufacturing the OLED display device 400 by way of example. Accordingly, the present embodiment may be applied to the OLED display devices 100, 200, and 300 of other embodiments as it is or in a modified manner.

Figure 12A:
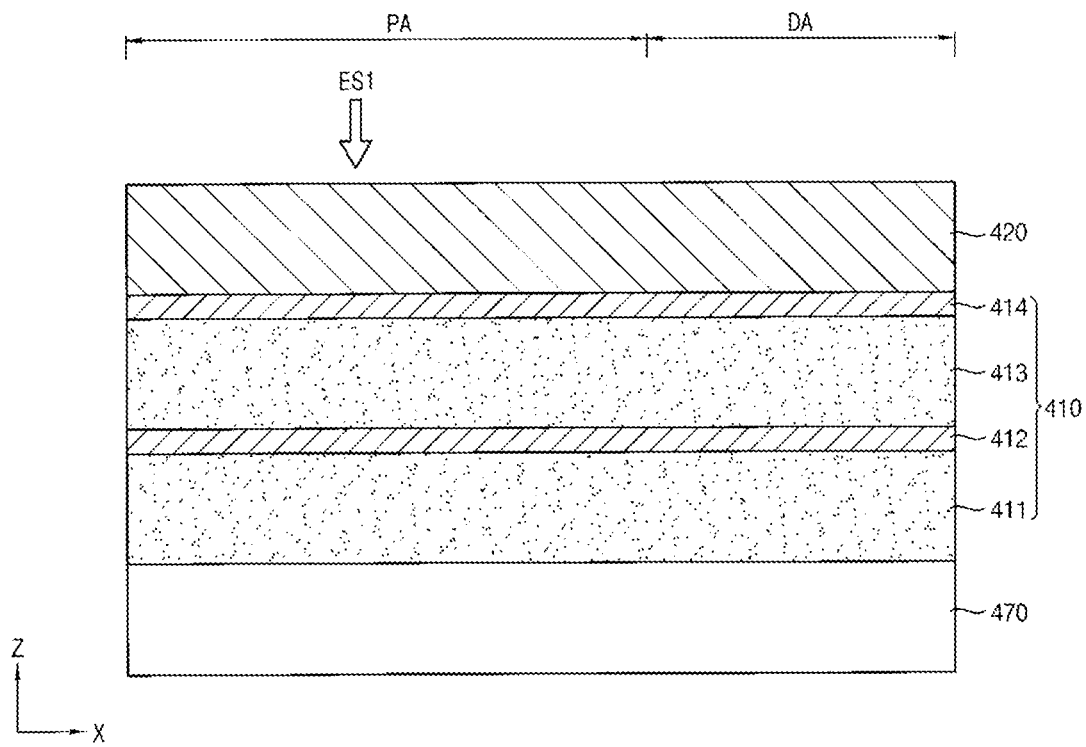
FIGS. 12A, 12B, 12C, 12D, 12E, 12F, 12G, and 12H are cross-sectional views illustrating a method of manufacturing an OLED display device according to an embodiment.

Referring to FIG. 12A, as described hereinabove with reference to FIGS. 11A to 11F, the carrier substrate 470 may be prepared, and the flexible substrate 410 and the substructure 420 may be formed on the carrier substrate 470.

Figure 12B:
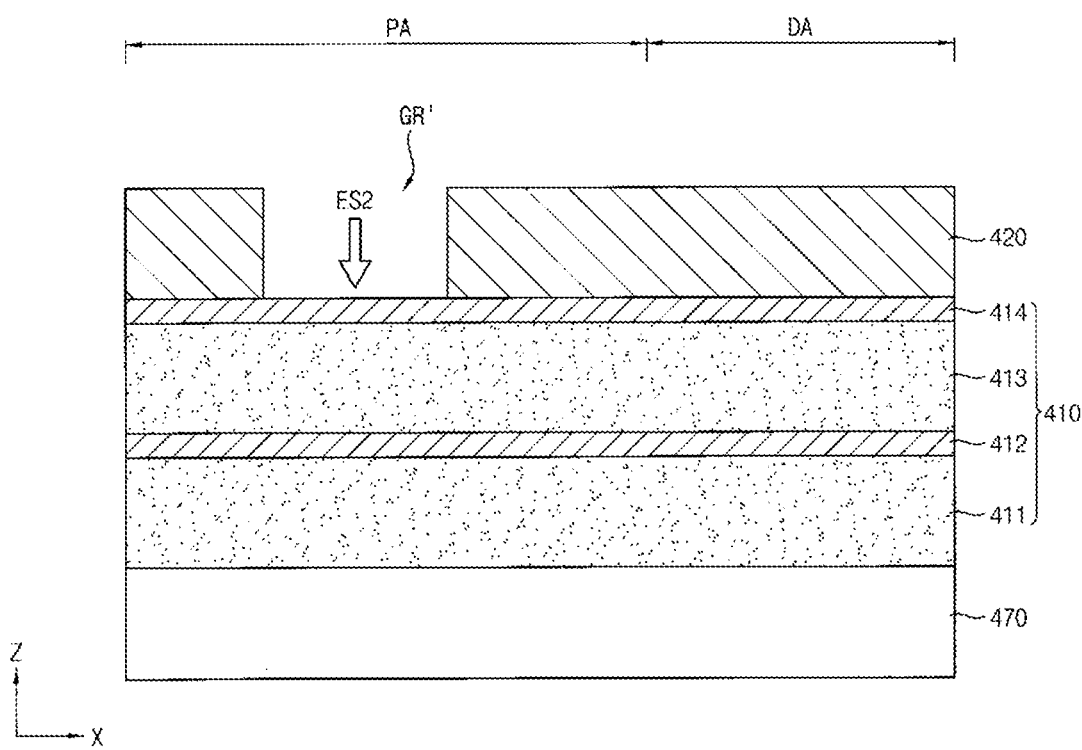

Referring to FIG. 12B, a preliminary groove GR' may be defined through the substructure 420.

The preliminary groove GR' may be defined at the peripheral area PA corresponding to the groove GR described below. The preliminary groove GR' may be defined using a first etching source ES1, as illustrated in FIG. 12A. The first etching source ES1 may be of various types and may include, for example, a laser.

Figure 12C:
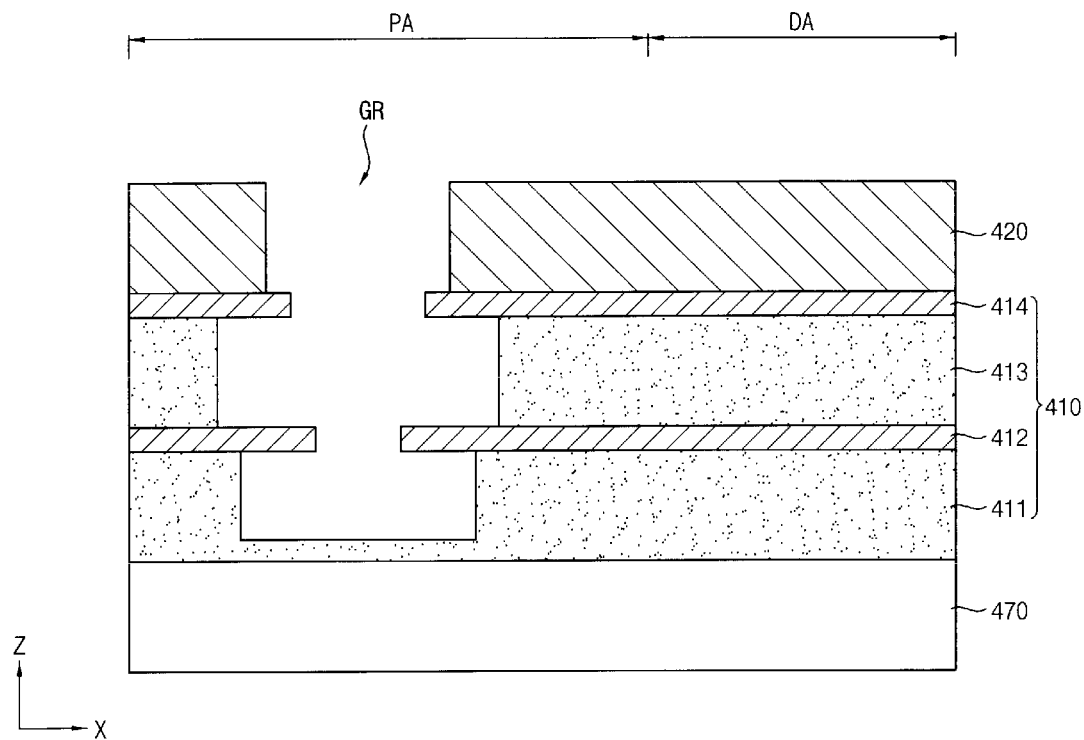

Referring to FIG. 12C, the groove GR that is undercut may be defined at the flexible substrate 410.

The groove GR may be defined at the flexible substrate 410 that is exposed by the preliminary groove GR' using a second etching source ES2, as illustrated in FIG. 12B. The second etching source ES2 may be of various types and may include, for example, a laser.

The groove GR may be defined at the first substrate layer 411, the first barrier layer 412, the second substrate layer 413, and the second barrier layer 414. For example, the groove GR may correspond to a part of a thickness of the first substrate layer 411, the entirety of a thickness of the first barrier layer 412, the entirety of a thickness of the second substrate layer 413, and the entirety of a thickness of the second barrier layer 414. In such an embodiment, a side surface and an upper surface of the first substrate layer 411, a side surface, an upper surface, and a bottom surface of the first barrier layer 412, a side surface of the second substrate layer 413, and a side surface, a bottom surface, and an upper surface of the second barrier layer 414 may be exposed. The entirety of the first barrier layer 412 and/or the second barrier layer 414 that is exposed may have a waveform. A portion of the first barrier layer 412 that has a waveform is exposed and a remaining portion of the first barrier layer 412 that has a waveform is covered by the first substrate layer 411 and the second substrate layer 413. A portion of the second barrier layer 414 that has a waveform is exposed, and a remaining portion of the second barrier layer 414 that has a waveform is covered by the second substrate layer 413 and the substructure 420.

The groove GR may be defined integrally at the first substrate layer 411, the first barrier layer 412, the second substrate layer 413, and the second barrier layer 414. For example, a laser is applied from the above the flexible substrate 410, and thus the groove GR may be defined at the first substrate layer 411, the first barrier layer 412, the second substrate layer 413, and the second barrier layer 414 in a single process. However, since materials respectively forming the first and second substrate layers 411 and 413 and the first and second barrier layers 412 and 414 are different from each other, thus causing respectively different laser absorption rates, and thus a width of the groove GR may not be uniform.

A laser absorption rate of the first substrate layer 411 may be greater than a laser absorption rate of the first barrier layer 412. Accordingly, the first substrate layer 411 may be undercut at the groove GR with respect to the first barrier layer 412. In other words, at the groove GR, the first barrier layer 412 may protrude as compared to the first substrate layer 411. In addition, a laser absorption rate of the second substrate layer 413 may be greater than a laser absorption rate of the second barrier layer 414. Accordingly, the second substrate layer 413 may be undercut at the groove GR with respect to the second barrier layer 414. In other words, at the groove GR, the second barrier layer 414 may protrude as compared to the second substrate layer 413.

In an embodiment, the first barrier layer 412 and the second barrier layer 414 that protrude have a waveform. The waveform is straight in shape in a protruding direction, for example, a width direction of the groove GR, a direction perpendicular to the side surface of the first substrate layer 411 that is exposed by the groove GR on a plane, or a radial direction toward the center CE of the through hole TH. The waveform has a waveform in a length direction of the groove GR, a direction parallel to the side surface of the first substrate layer 411 that is exposed by the groove GR on a plane, or a circumferential direction perpendicular to the radial direction. In addition, the first barrier layer 412 of which a bottom surface is not exposed by the first substrate layer 411 and the second barrier layer 414 of which a bottom surface is not exposed by the second substrate layer 413 may have a waveform.

In a case where laser is applied several times, since the groove GR is defined downward from an upper portion of the flexible substrate 410, the upper portion of the flexible substrate 410 may be more exposed to the laser than a lower portion of the flexible substrate 410. Accordingly, the width of the groove GR may decrease downward from the upper portion of the flexible substrate 410. For example, a width of the groove GR at the second barrier layer 414 may be larger than a width of the groove GR at the first barrier layer 412. In addition, a width of the groove GR at the second substrate layer 413 may be larger than a width of the groove GR at the first substrate layer 411.

In an embodiment, when a process of defining the groove GR using, for example, a laser is completed, it is necessary to remove a residual material generated during the process of defining the groove GR before forming the common layer 440. To this end, a cleaning method using high-pressure water may be employed. There is a risk that the first barrier layer 412 and the second barrier layer 414 that protrude may be damaged in the cleaning process. According to an embodiment, since the first barrier layer 412 and/or the second barrier layer 414 have a waveform in a direction perpendicular to the protruding direction, the risk of the damage caused by a pressure applied to end portions of the first barrier layer 412 and/or the second barrier layer 414 may be reduced.

Figure 12D:
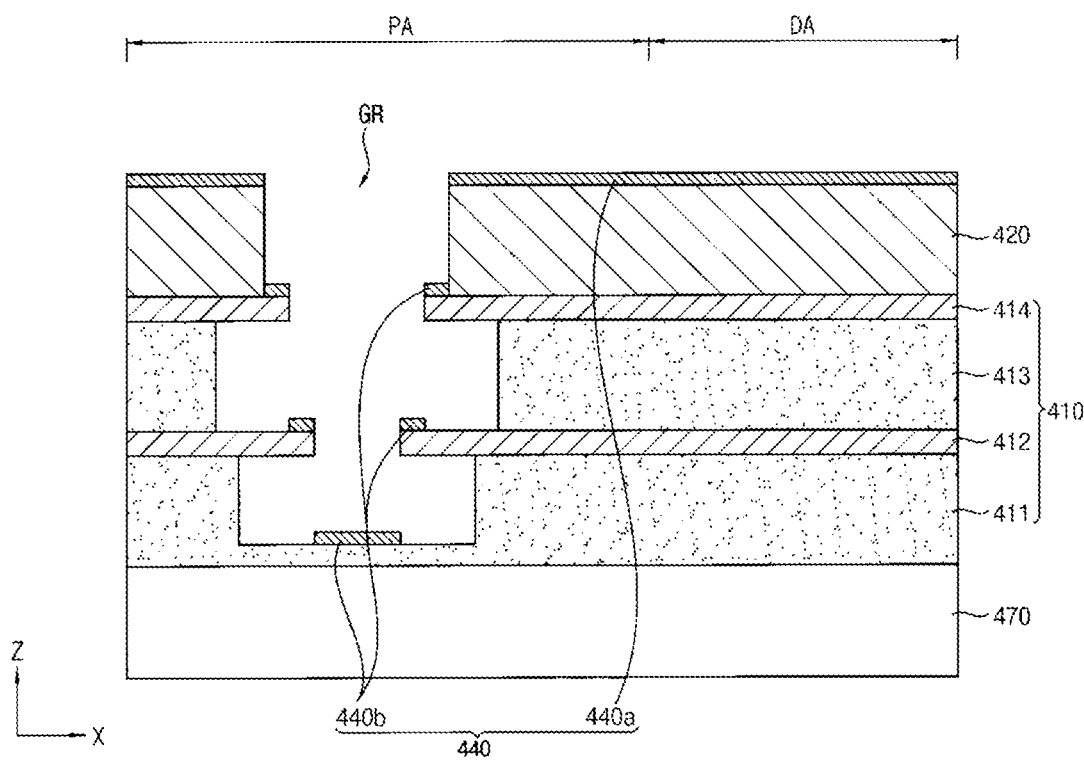

Referring to FIG. 12D, the common layer 440 that is disconnected by the groove GR may be formed on the flexible substrate 410.

As described above, the common layer 440 may include at least one of the first functional layer 441 (see FIGS. 9-10), the second functional layer 443 (see FIGS. 9-10), the common electrode 444 (see FIGS. 9-10), and the capping layer 115 (see FIGS. 9-10). The common layer 440 may be formed entirely on the flexible substrate 410 throughout the display area DA and the peripheral area PA. The common layer 440 may be formed by various methods such as a vapor deposition method, a coating method, a printing method, and a photo-thermal transfer method.

In the case where the common layer 440 extends from the display area DA to the peripheral area PA, moisture and/or oxygen may be externally introduced to an edge of the common layer 440, and such moisture and/or oxygen may be introduced into the display area DA through the peripheral area PA via the common area 440, possibly deteriorating pixels. Therefore, it is necessary to block a path through which moisture and/or oxygen may be introduced.

As described above, the groove GR may be defined at the peripheral area PA, and the groove GR may have an undercut shape. Accordingly, the first portion 440a of the common layer 440 formed outside the groove GR and the second portion 440b of the common layer 440 formed in the groove GR may be disconnected from each other. In such an embodiment, the common layer 440 may be disconnected without any additional step for disconnecting the common layer 440, and the path through which moisture and/or oxygen may be introduced may be blocked.

Figure 12E:
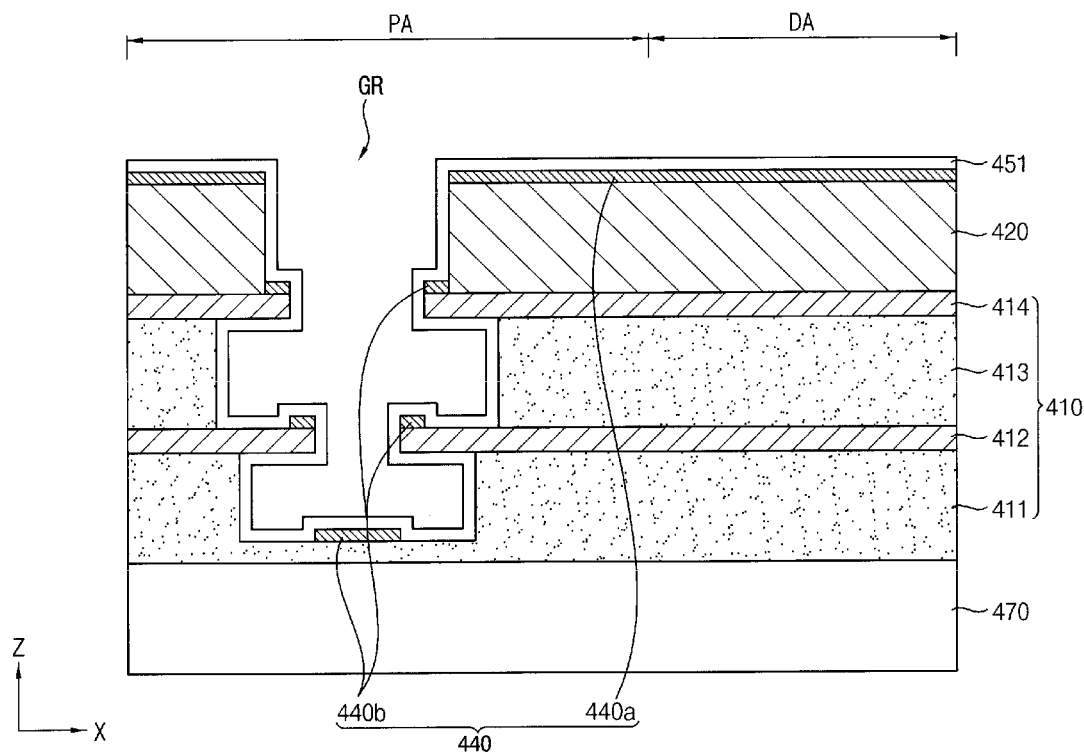
Figure 12F:
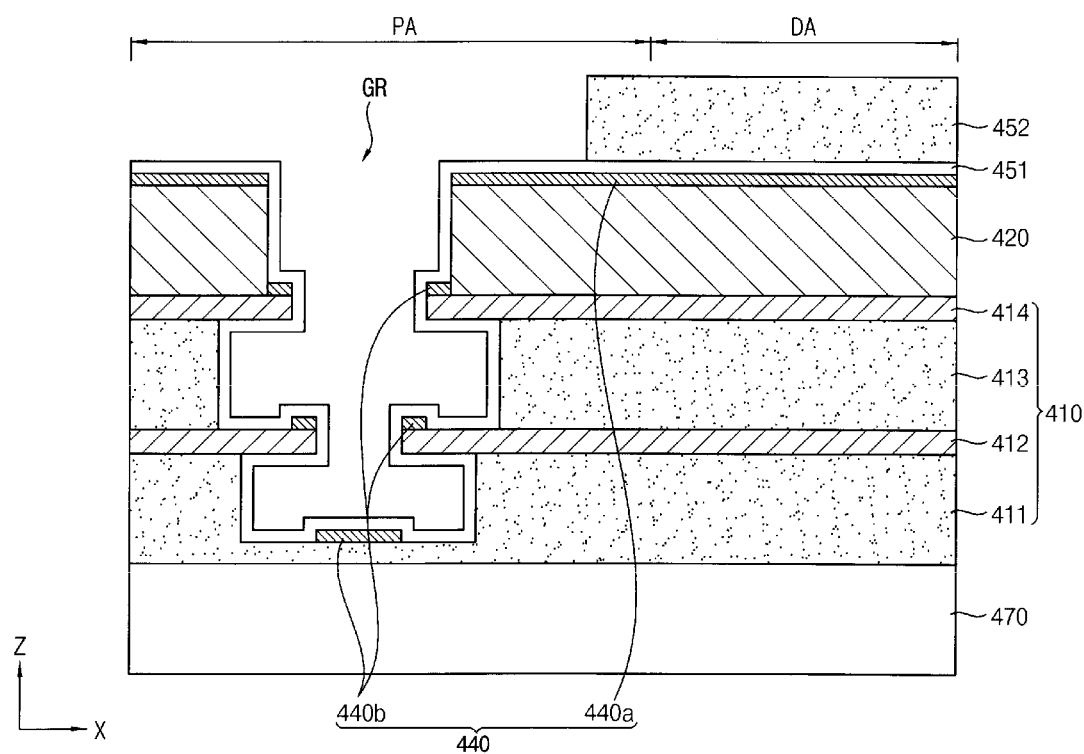
Figure 12G:
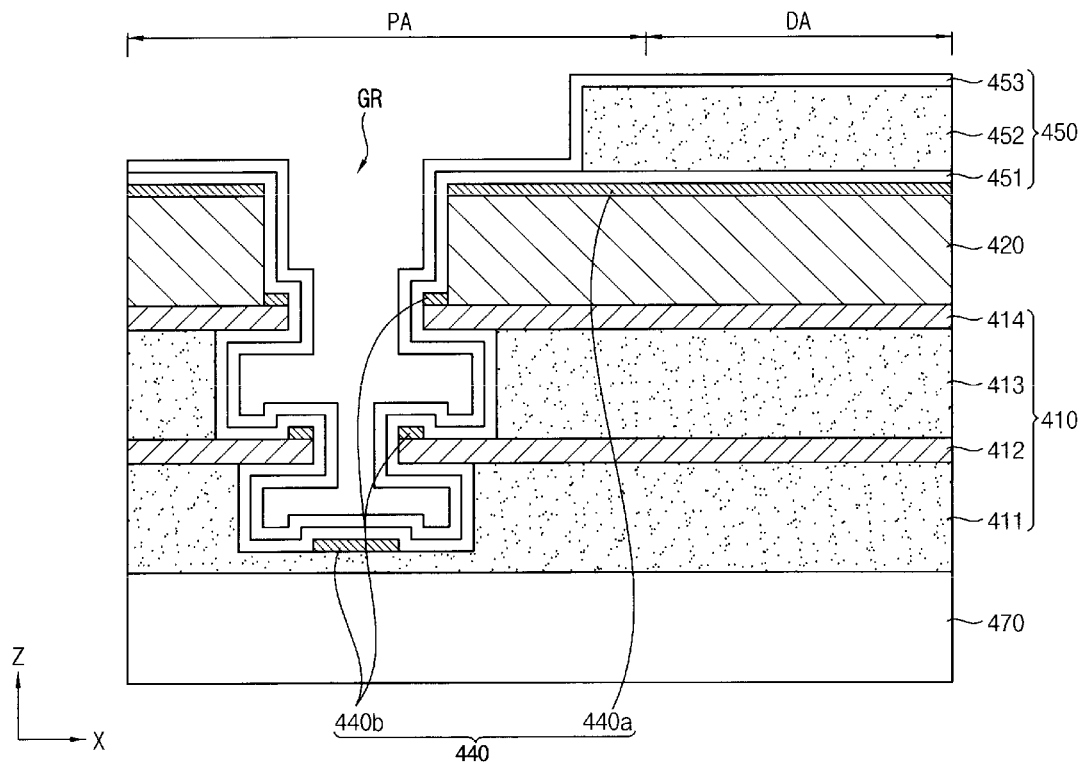

Referring to FIGS. 12E, 12F, and 12G, the sealing member 450 covering the common layer 440 may be formed on the common layer 440.

First, as illustrated in FIG. 12E, the first inorganic layer 451 may be formed on the common layer 440. The first inorganic layer 451 may be formed throughout the outside and inside of the groove GR. In specific, the first inorganic layer 451 may cover the first portion 440a of the common layer 440 outside the groove GR, the second portion 440a of the common layer 440 in the groove GR, and a surface of the flexible substrate 410 and a surface of the substructure 420 that are exposed by the groove GR. The first inorganic layer 451 may be formed using an inorganic material by various deposition methods, such as a chemical vapor deposition method, an atomic layer deposition method, and a sputtering method.

Next, as illustrated in FIG. 12F, the organic layer 452 may be formed on the first inorganic layer 451. The organic layer 452 may be formed outside the groove GR in a selective manner. In other words, the organic layer 452 may not be formed in the groove GR. The organic layer 452 may be formed by an inkjet printing method or a slot die coating method, for example.

Next, as illustrated in FIG. 12G, the second inorganic layer 453 that covers the organic layer 452 may be formed on the first inorganic layer 451. The second inorganic layer 453 may be formed throughout the outside and inside of the groove GR. In specific, the second inorganic layer 453 may be formed along the profile of the first inorganic layer 451 in the groove GR. The second inorganic layer 453 and the first inorganic layer 451 may include a substantially same material and may be formed in a substantially same method.

Since the sealing member 450 is formed in accordance with a curvature formed in the groove GR, an adhesion area between the flexible substrate 410 and the sealing member 450 may increase as compared to a case where the groove GR is not defined. Accordingly, an adhesive force between the flexible substrate 410 and the sealing member 450 may increase.

Figure 12H:
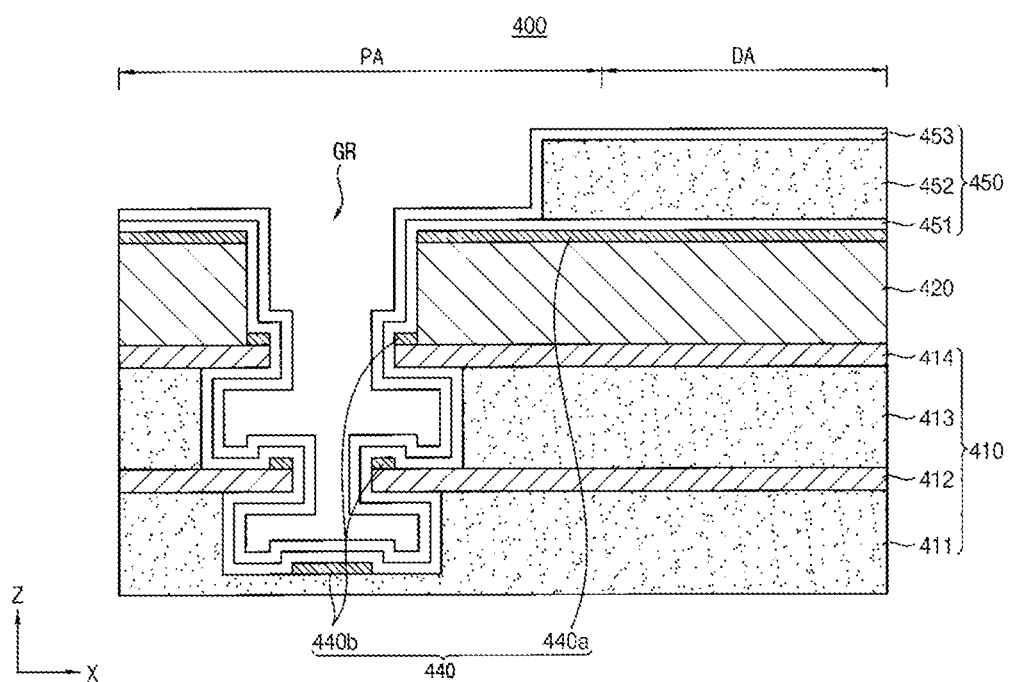

Referring to FIG. 12H, the carrier substrate 470 may be separated from the flexible substrate 410.

In order to separate the carrier substrate 470 from the flexible substrate 410, a laser may be applied to a surface of the carrier substrate 470 that is opposite to a surface of the carrier substrate 470 on which the flexible substrate 410 is formed. The first substrate layer 411 and the second substrate layer 413 may absorb the laser, and thus a bonding force between the flexible substrate 410 and the carrier substrate 470 may be weakened. Next, the carrier substrate 470 may be separated from the flexible substrate 410 using a mechanical stress.

Hereinafter, a cross-sectional structure of an OLED display device according to an embodiment will be described in detail with reference to FIG. 13.

Figure 13:
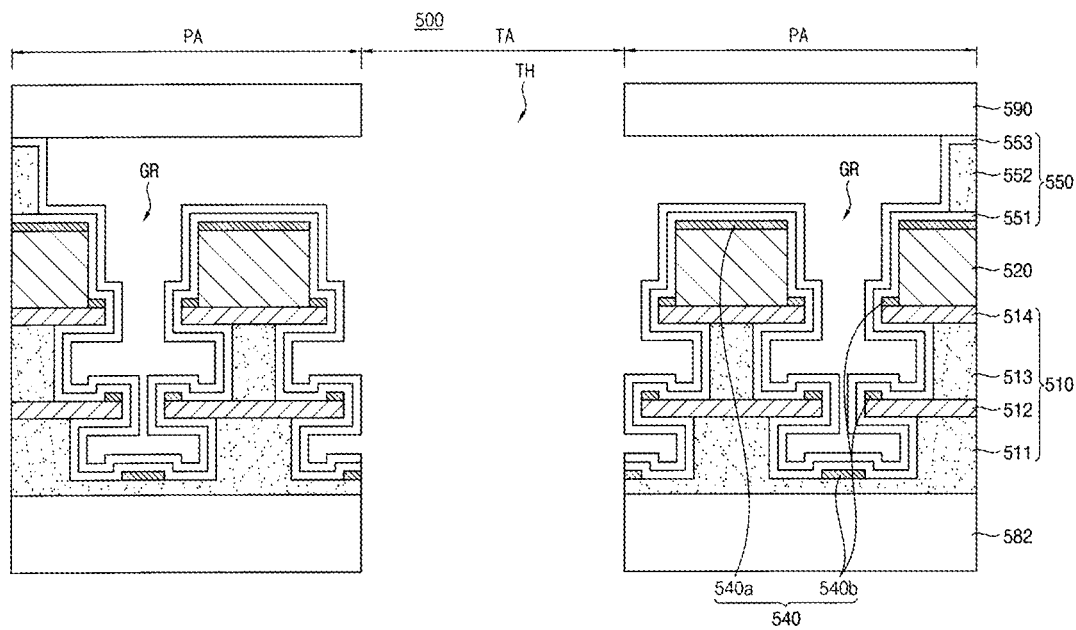
FIG. 13 is a cross-sectional view illustrating an OLED display device according to an embodiment.

FIG. 13 is a cross-sectional view illustrating an OLED display device according to an embodiment.

An embodiment illustrated in FIG. 13 is substantially the same as an embodiment illustrated in FIG. 8 except for a lower protective film, a polarizing member, and a through hole, so repeated description will be omitted.

Referring to FIG. 13, an OLED display device 500 according to an embodiment includes a flexible substrate 510, a common layer 540, a sealing member 550, a lower protective film 582, and a polarizing member 590.

The lower protective film 582 may be disposed on a bottom surface of the flexible substrate 510. The lower protective film 582 may absorb external shocks and prevent the OLED display device 500 from being damaged by the shocks. The lower protective film 582 may include a material capable of absorbing shocks by containing air, for example, cushion and sponge.

The polarizing member 590 may be disposed on the sealing member 550. The polarizing member 590 may offset externally incident light so that light may be dissipated. In other words, the polarizing member 590 may serve to suppress reflection of external light.

The OLED display device 500 may have a through hole TH. The through hole TH may correspond to the entirety of a thickness of the OLED display device 500. In specific, the through holes TH may be defined through the lower protective film 582, the flexible substrate 510, the common layer 540, the sealing member 550, and the polarizing member 590. A through area TA of the OLED display device 500 may be defined by the through hole TH.

At least a part of the peripheral area PA that is exposed by the through hole TH may be covered by the sealing member 550. For example, as illustrated in FIG. 13, a side portion of the flexible substrate 510, a side portion of the substructure 520, and a side portion of the common layer 540 may be covered by a first inorganic layer 551 and a second inorganic layer 553 of the sealing member 550. Accordingly, the sealing member 550 may substantially prevent or reduce introduction of moisture and/or oxygen to an edge of the peripheral area PA that is exposed by the through hole TH.

Hereinafter, a method of manufacturing an OLED display device according to an embodiment will be described in detail with reference to FIGS. 14A to 14H.

FIGS. 14A to 14F are cross-sectional views illustrating a method of manufacturing an OLED display device according to an embodiment.

In specific, FIGS. 14A to 14F show a method of manufacturing the OLED display device 500 of FIG. 13. In the method of manufacturing the OLED display device 500 according to an embodiment illustrated in FIGS. 14A to 14F, a description substantially the same as or similar to the method of manufacturing the OLED display device 400 according to an embodiment will be omitted.

Figure 14A:
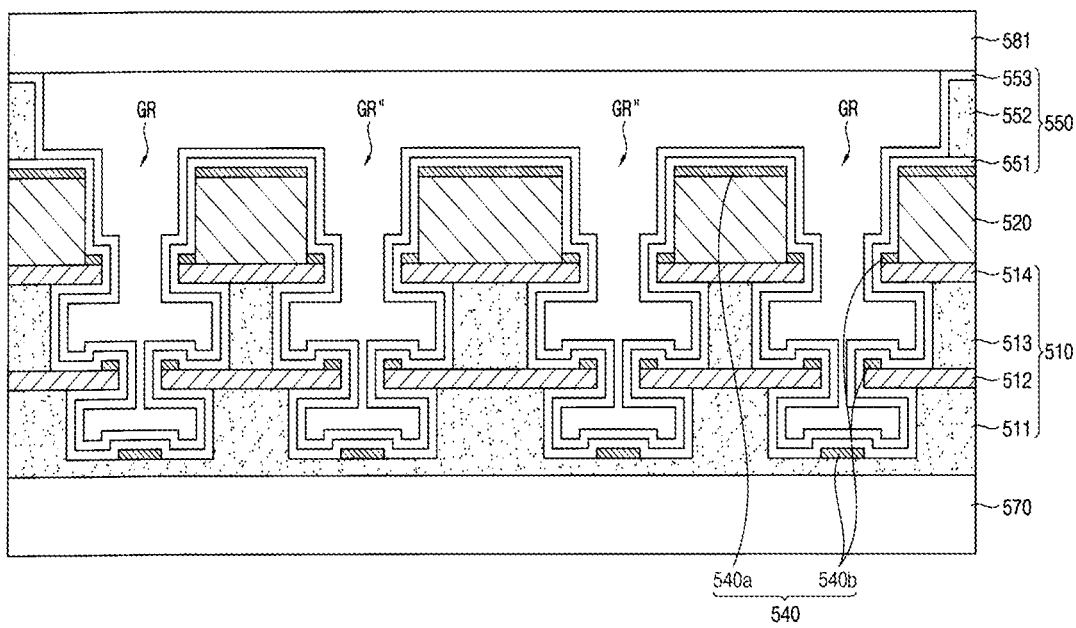
FIGS. 14A, 14B, 14C, 14D, 14E, and 14F are cross-sectional views illustrating a method of manufacturing an OLED display device according to an embodiment.

Referring to FIG. 14A, an upper protective film 581 may be attached on the sealing member 550.

A carrier substrate 570 is attached at a lower portion of the OLED display device 500, and the upper protective film 581 may be attached on the sealing member 550 of the OLED display device at which a plurality of grooves GR and GR" are defined. As illustrated in FIG. 14A, in addition to the groove GR that corresponds to the groove GR illustrated in FIG. 13, a preliminary groove GR" may be further defined at the OLED display device 500. The groove GR may enclose the preliminary groove GR". The preliminary groove GR" may be at least partially exposed by the through hole TH at the time of defining the through hole TH to be described below.

The upper protective film 581 may protect the sealing member 550. The sealing member 550 may be easily damaged by external scratches or foreign matter during a process of manufacturing the OLED display device 500. In order to substantially prevent the sealing member 550 from being damaged, the upper protective film 581 may be disposed to substantially eliminate or reduce the restriction on the process.

Figure 14B:
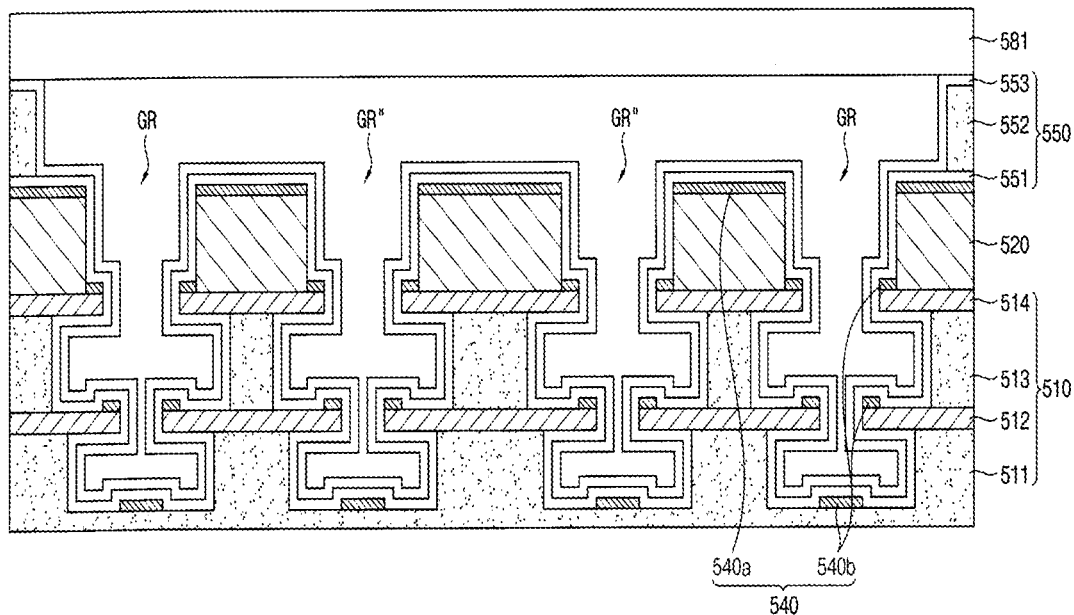
Figure 14C:
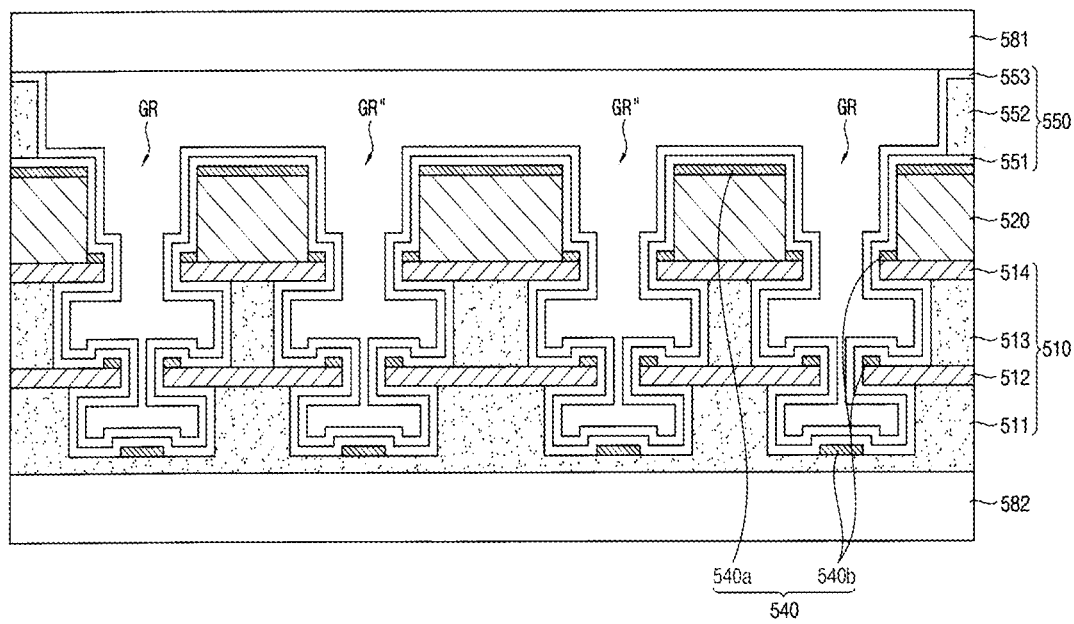

Referring to FIGS. 14B and 14C, the carrier substrate 570 is separated from the flexible substrate 510, and the lower protective film 582 may be attached to one surface of the flexible substrate 510 from which the carrier substrate 570 is separated off. The lower protective film 582 may substantially prevent a surface of the flexible substrate 510 from being damaged during the process.

Figure 14D:
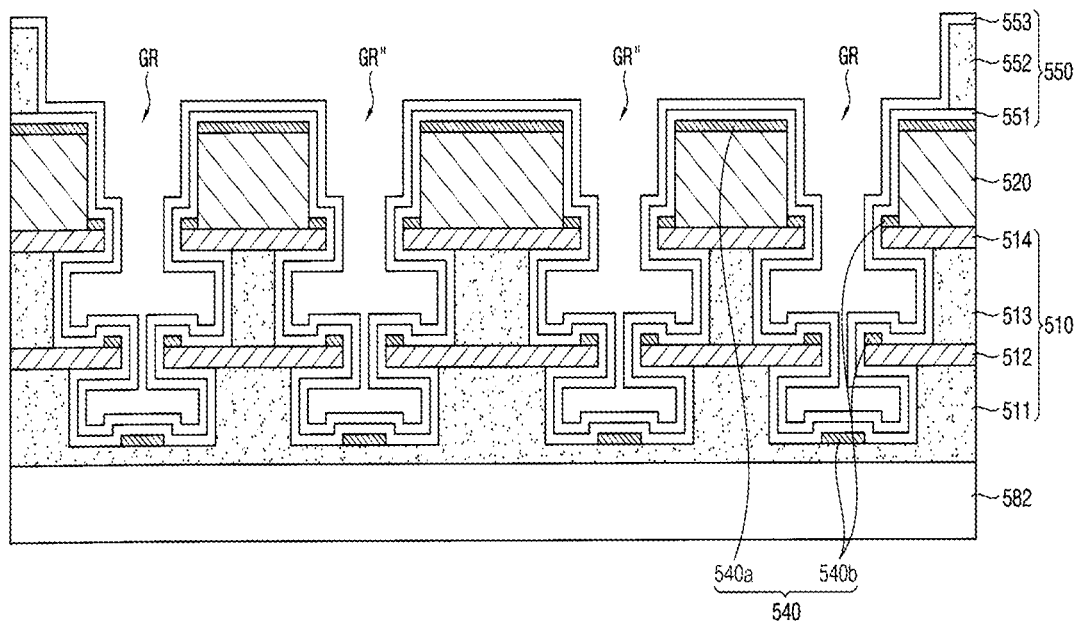

Referring to FIG. 14D, the upper protective film 581 may be removed. The upper protective film 581 is formed to substantially prevent damages, e.g., foreign matter or scratch of the sealing member 550, during the process, and may be removed before a functional member (e.g., a polarizing member) is formed on the sealing member 550.

Figure 14E:
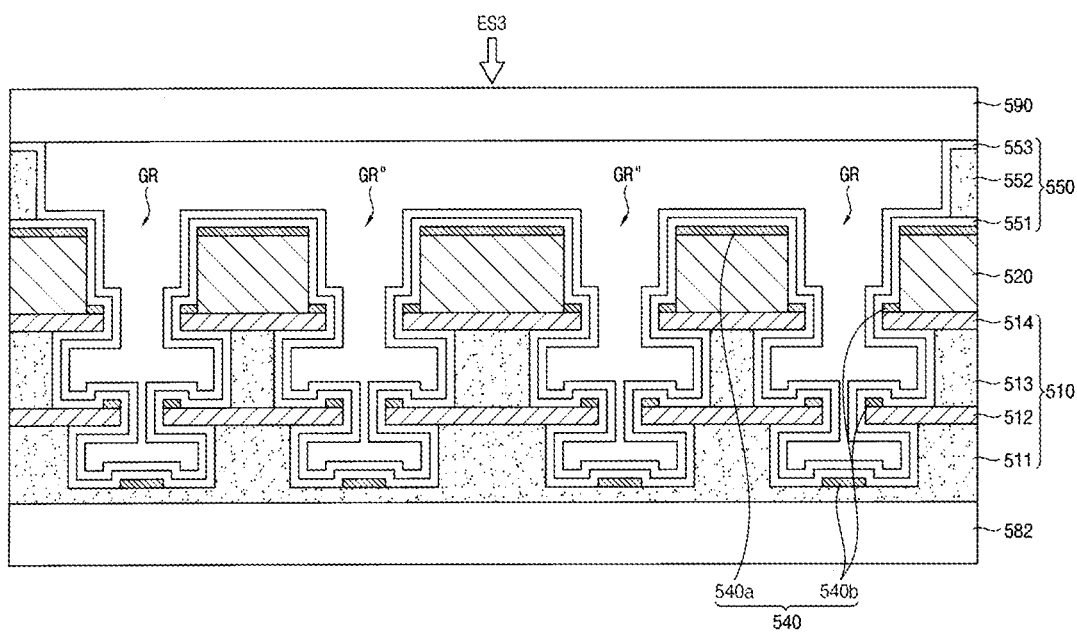

Referring to FIG. 14E, the polarizing member 590 may be formed on the sealing member 550.

Figure 14F:
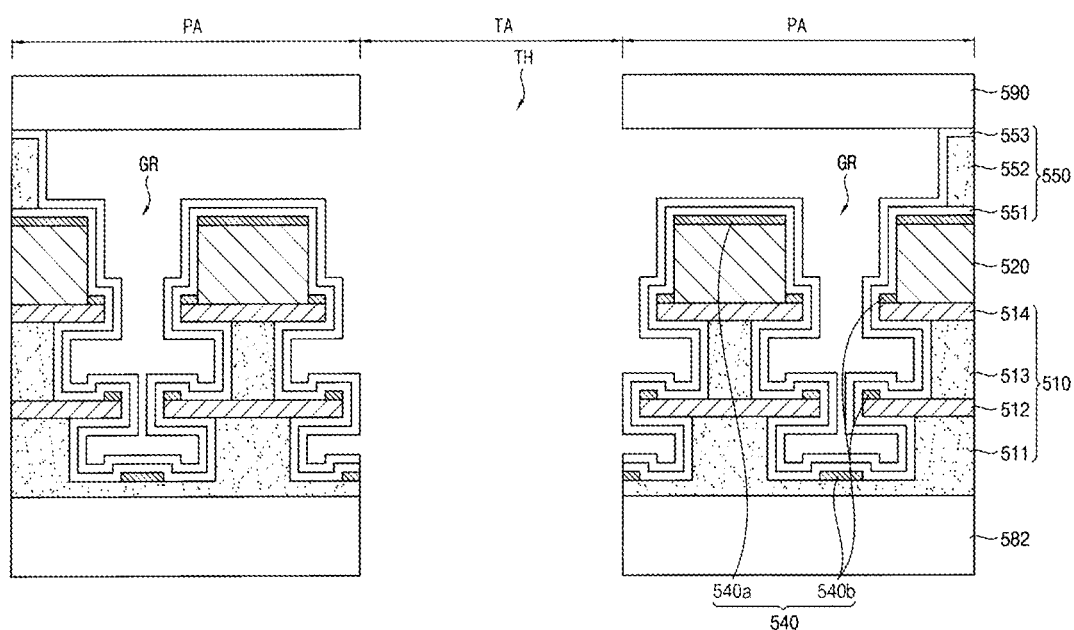

Referring to FIG. 14F, the through hole TH may be defined at the OLED display device 500.

The through hole TH may be defined using a third etching source ES3, as illustrated in FIG. 14E. The third etching source ES3 may be of various types and may include, for example, a laser.

The through hole TH may be defined through the lower protective film 582, the flexible substrate 510, the common layer 540, the sealing member 550 and the polarizing member 590. In other words, the through hole TH may correspond to the entirety of a thickness of the OLED display device 500.

At least a part of the preliminary groove GR" may be exposed by the through hole TH. Accordingly, the preliminary groove GR" may provide a reference for defining the through hole TH. For example, the OLED display device 500 may be cut along the preliminary groove GR" to define the through hole TH. Since the through hole TH is defined with respect to the preliminary groove GR", at least a part of the peripheral area PA that is exposed by the through hole TH may be covered by the sealing member 550. Accordingly, the sealing member 550 may substantially block or reduce introduction of moisture and/or oxygen to an edge of the peripheral area PA that is exposed by the through hole TH.

INDUSTRIAL APPLICABILITY

The OLED display device according to one or more embodiments may be applied to a display device included in a computer, a notebook computer, a mobile phone, a smart phone, a smart pad, a PMP, a PDA, or an MP3 player, for example.

As set forth hereinabove, in a display device according to one or more embodiments, since the barrier layer has a waveform formed in a direction perpendicular to a direction in which the barrier layer protrudes, it is possible to reduce the risk that the protruding barrier layer is damaged by the pressure applied to an end portion thereof.

While the inventive concept has been illustrated and described with reference to the embodiments thereof, it will be apparent to those of ordinary skill in the art that various changes in form and detail may be made thereto without departing from the spirit and scope of the inventive concept.

What is claimed is:

1. An organic light emitting display device comprising:
   a flexible substrate having a groove that is undercut and a circular through hole;
   a common layer disposed on the flexible substrate, comprising an organic light emitting layer, and disconnected by the groove; and
   a sealing member disposed on the common layer and covering the common layer,
   wherein the flexible substrate comprises a first substrate layer and a first barrier layer disposed on the first substrate layer,
   the first barrier layer protrudes with respect to the first substrate layer at the groove, and
   the first barrier layer that protrudes has a waveform, the waveform having a wavelength of a predetermined value, wherein the first barrier layer has a straight line shape in a first direction in which the first barrier layer protrudes and has the waveform in a second direction that is perpendicular to the first direction, the first direction being a radial direction towards a center of the through hole, and the second direction is a circumferential direction with respect to the center.

2. The organic light emitting display device of claim 1, wherein in the second direction, the waveform has ridges and valleys, and a ratio of a height difference between the ridges and the valleys to a distance between adjacent ones of the ridges is in a range from about ⅕ to about 5.

3. The organic light emitting display device of claim 2, wherein the ratio of the height difference between the ridges and the valleys to the distance between adjacent ones of the ridges is in a range from about ½ to about 2.

4. The organic light emitting display device of claim 1, wherein
   the groove encloses the through hole.

5. The organic light emitting display device of claim 1, wherein at least a portion of the first barrier layer that contacts the first substrate layer has the waveform.

6. The organic light emitting display device of claim 5, wherein a length of the at least a portion of the first barrier layer is substantially equal to or longer than a length of a protruding portion of the first barrier layer in the first direction.

7. The organic light emitting display device of claim 1, wherein the first barrier layer that has the waveform is located between a display area at which images are configured to be displayed and the through hole.

8. The organic light emitting display device of claim 7, wherein the first barrier layer comprises a first intermediate barrier layer which connects the first barrier layer that is located at the display area and the first barrier layer that has the waveform.

9. The organic light emitting display device of claim 8, wherein the first intermediate barrier layer extends upward from the first barrier layer that has the waveform.

10. The organic light emitting display device of claim 8, wherein the first intermediate barrier layer extends downward from the first barrier layer that has the waveform.

11. The organic light emitting display device of claim 1, wherein the flexible substrate further comprises a second substrate layer disposed on the first barrier layer and a second barrier layer disposed on the second substrate layer, and
the second barrier layer protrudes with respect to the second substrate layer at the groove.

12. The organic light emitting display device of claim 11, wherein the second barrier layer that protrudes has a waveform.

13. The organic light emitting display device of claim 12, wherein the waveform of the second barrier layer corresponds to the waveform of the first barrier layer.

14. The organic light emitting display device of claim 11, wherein the second barrier layer that protrudes is planar.

15. The organic light emitting display device of claim 11, wherein the second substrate layer includes one or more selected from a group consisting of polyimide (PI), polyethylene naphthalate (PEN), polyethylene terephthalate (PET), polyarylate, polycarbonate (PC), polyetherimide (PEI), and polyethersulfone (PES).

16. The organic light emitting display device of claim 1, wherein the first substrate layer includes one or more selected from a group consisting of polyimide (PI), polyethylene naphthalate (PEN), polyethylene terephthalate (PET), polyarylate, polycarbonate (PC), polyetherimide (PEI), and polyethersulfone (PES).

17. An organic light emitting display device comprising:
a substrate including a display area, a circular through area, and a peripheral area and having a groove that is undercut and defined at the peripheral area;
an organic light emitting element disposed on the substrate at the display area;
a common layer disposed on the substrate at the peripheral area and disconnected by the groove; and
a sealing member disposed on the organic light emitting element and the common layer,
wherein the substrate comprises a substrate layer and a barrier layer that is disposed on the substrate layer and protrudes with respect to the substrate layer, and
the barrier layer on the peripheral area has a waveform, the waveform having a wavelength of a predetermined value, wherein the barrier layer has a straight line shape in a first direction in which the first barrier layer protrudes and has the waveform in a second direction that is perpendicular to the first direction, the first direction being a radial direction towards a center of the through area, and the second direction is a circumferential direction with respect to the center.

18. The organic light emitting display device of claim 17, wherein the peripheral area is located between the display area and the through area.

19. The organic light emitting display device of claim 18, wherein the peripheral area surrounds the through area, and the display area surrounds the peripheral area.

* * * * *